US012586616B2

(12) United States Patent
Zurla et al.

(10) Patent No.: US 12,586,616 B2
(45) Date of Patent: Mar. 24, 2026

(54) IN-MEMORY COMPUTATION DEVICE FOR PERFORMING A SIGNED MAC OPERATION

(71) Applicant: STMicroelectronics International N.V., Geneva (CH)

(72) Inventors: Riccardo Zurla, Binasco (IT); Marco Pasotti, Travaco' Siccomario (IT)

(73) Assignee: STMicroelectronics International N.V., Geneva (CH)

( * ) Notice: Subject to any disclaimer, the term of this patent is extended or adjusted under 35 U.S.C. 154(b) by 101 days.

(21) Appl. No.: 18/731,557

(22) Filed: Jun. 3, 2024

(65) Prior Publication Data

US 2024/0404568 A1      Dec. 5, 2024

(30) Foreign Application Priority Data

Jun. 5, 2023      (IT) ........................ 102023000011343

(51) Int. Cl.
  *G11C 7/10*          (2006.01)
  *G11C 7/12*          (2006.01)
        (Continued)

(52) U.S. Cl.
  CPC ............... *G11C 7/109* (2013.01); *G11C 7/12* (2013.01); *G11C 7/222* (2013.01); *G06F 7/5443* (2013.01); *G06F 2207/4814* (2013.01)

(58) Field of Classification Search
  CPC ........... G11C 7/109; G11C 7/12; G11C 7/222; G06F 2207/4814; G06F 7/5443
        (Continued)

(56) References Cited

U.S. PATENT DOCUMENTS 11,176,993 B2    11/2021  Kim et al.
2019/0042199 A1    2/2019  Sumbul et al.
          (Continued)

FOREIGN PATENT DOCUMENTS

CN       110197253 A     9/2019
CN       115210810 A    10/2022
          (Continued)

OTHER PUBLICATIONS

IT Search Report and Written Opinion for priority application, IT Appl. No. 102023000011343, report dated Dec. 8, 2023, 9 pgs.

*Primary Examiner* — Ly D Pham
(74) *Attorney, Agent, or Firm* — Crowe & Dunlevy LLC

(57)          ABSTRACT

An in-memory computation device performs a multiply-and-accumulate (MAC) operation. A computation array includes groups of memory cells coupled to a bitline, each group storing a computational weight and having a positive cell flowing a positive-cell current and a negative cell flowing a negative-cell current which are a function of a total current and the sign and absolute value of the respective computational weight. A row-activation circuit receives an input signal and provides, for each input value, during an elaboration interval, a positive-activation signal having a positive-activation duration and a negative-activation signal having a negative-activation duration, the durations being a function of an elaboration duration and of the sign and absolute value of the respective input value. A column-elaboration circuit samples bitline current and provides, in response thereto, at least one output signal.

25 Claims, 13 Drawing Sheets

(51) Int. Cl.
*G11C 7/22* (2006.01)
*G06F 7/544* (2006.01)
(58) Field of Classification Search
USPC .......................................................... 365/191
See application file for complete search history.

(56) References Cited

U.S. PATENT DOCUMENTS

| | | | | |
|---|---|---|---|---|
| 2020/0174786 A1 | 6/2020 | Zhang et al. | | |
| 2020/0310758 A1 | 10/2020 | Desoli et al. | | |
| 2020/0310761 A1 | 10/2020 | Rossi et al. | | |
| 2022/0043885 A1 | 2/2022 | La Rosa et al. | | |
| 2022/0238151 A1 | 7/2022 | Lin et al. | | |
| 2022/0244916 A1 | 8/2022 | Lee et al. | | |
| 2022/0246212 A1 | 8/2022 | Lue et al. | | |
| 2023/0238055 A1* | 7/2023 | Pasotti | .............. | G11C 13/0026 |
| | | | | 365/230.03 |
| 2024/0112004 A1 | 4/2024 | An et al. | | |
| 2024/0176586 A1* | 5/2024 | Carissimi | .......... | G11C 13/0028 |
| 2025/0080118 A1* | 3/2025 | Pasotti | ................. | G06F 7/5443 |

FOREIGN PATENT DOCUMENTS

| | | | |
|---|---|---|---|
| CN | 115312095 A | 11/2022 | |
| TW | 202013213 A | 4/2020 | |

* cited by examiner $$Q_{ij} = I^+_{ij} \cdot T_{j,+} + I^-_{ij} \cdot T_{j,-}$$

| $G_{ij}$ | $I^-_{ij}$; $I^+_{ij}$ | $x_j = -64$ $T_{j,+} = 0$ ns $T_{j,-} = 128$ ns | $x_j = -32$ $T_{j,+} = 32$ns $T_{j,-} = 96$ ns | $x_j = 0$ $T_{j,+} = 64$ ns $T_{j,-} = 64$ ns | $x_j = +32$ $T_{j,+} = 96$ ns $T_{j,-} = 32$ns | $x_j = +64$ $T_{j,+} = 128$ ns $T_{j,-} = 0$ ns |
|---|---|---|---|---|---|---|
| -1 | 2uA; 0uA | 256 | 192 | 128 | 64 | 0 |
| 0 | 1uA; 1uA | 128 | 128 | 128 | 128 | 128 |
| +1 | 0uA; 2uA | 0 | 64 | 128 | 192 | 256 |

$Q_{ref}$

FIG. 8

$$Q_{ij} = I^+_{ij} \cdot T_{j,+} + I^-_{ij} \cdot T_{j,-}$$

| $G_{ij}$ | $I^-_{ij}$; $I^+_{ij}$ | $x_j = -64$ $T_{j,+} = 0$ ns $T_{j,-} = 128$ ns | $x_j = -32$ $T_{j,+} = 32$ns $T_{j,-} = 96$ ns | $x_j = 0$ $T_{j,+} = 64$ ns $T_{j,-} = 64$ ns | $x_j = +32$ $T_{j,+} = 96$ ns $T_{j,-} = 32$ns | $x_j = +64$ $T_{j,+} = 128$ ns $T_{j,-} = 0$ ns |
|---|---|---|---|---|---|---|
| -2 | 4uA; 0uA | 512 | 384 | 256 | 128 | 0 |
| -1 | 3uA; 1uA | 384 | 320 | 256 | 192 | 128 |
| 0 | 2uA; 2uA | 256 | 256 | 256 | 256 | 256 |
| +1 | 1uA; 3uA | 128 | 192 | 256 | 320 | 384 |
| +2 | 0uA; 4uA | 0 | 128 | 256 | 384 | 512 |

$Q_{ref}$

FIG. 18

IN-MEMORY COMPUTATION DEVICE FOR PERFORMING A SIGNED MAC OPERATION

PRIORITY CLAIM

This application claims the priority benefit of Italian Application for Patent No. 102023000011343, filed on Jun. 5, 2023, the contents of which is hereby incorporated by reference in its entirety to the maximum extent allowable by law.

TECHNICAL FIELD

Embodiments herein concern an in-memory computation (IMC) device for performing a multiply-and-accumulate (MAC) operation which has a low elaboration time. Furthermore, embodiments herein also concern a corresponding method for controlling the IMC device.

BACKGROUND

As is known, an in-memory computation (IMC) device uses the specific arrangement of the memory cells of a memory array for performing an analog elaboration of data. For instance, an IMC device is used for executing multiply-and-accumulate (MAC) operations, which are for example used for implementing automatic-learning algorithms, such as neural networks.

A MAC operation provides an output vector $Y=y_1, \ldots, y_M$ as result of the multiplication of an input vector $X=x_1, \ldots, x_N$ by a vector or matrix of computational weights G, for example:

$$\begin{bmatrix} y_1 \\ y_2 \\ \vdots \\ y_m \end{bmatrix} = \begin{bmatrix} g_{11} & g_{12} & \cdots & g_{1n} \\ g_{21} & g_{22} & \cdots & g_{2n} \\ \vdots & \vdots & \vdots & \vdots \\ g_{m1} & g_{m2} & \cdots & g_{mn} \end{bmatrix} \times \begin{bmatrix} x_1 \\ x_2 \\ \vdots \\ x_n \end{bmatrix}, \text{ i.e.:}$$

$$\begin{cases} y_1 = g_{11} \cdot x_1 + g_{12} \cdot x_2 + \ldots + g_{1N} \cdot x_N \\ y_2 = g_{21} \cdot x_1 + g_{22} \cdot x_2 + \ldots + g_{2N} \cdot x_N \\ \quad \vdots \\ y_M = g_{M1} \cdot x_1 + g_{M2} \cdot x_2 + \ldots + g_{MN} \cdot x_N \end{cases}$$

The IMC device stores the computational weights $g_{ij}$ in the cells of the memory and performs the operations of multiplication and addition at the cell level.

In detail, for each value $y_i$ of the output vector Y, the known IMC device generates a current indicative of a respective MAC operation, namely, $$y_i = \sum_{j=1}^{i=M} g_{ij} \cdot x_j,$$

and comprises a read circuit having a respective analog-to-digital converter (ADC) that discretizes said current.

The IMC device allows to avoid the need to transfer data backwards and forwards between a memory and an elaboration (e.g., processing) unit. Consequently, an IMC device has a performance that is not limited by the bandwidth of data transfer between the memory and the elaboration unit and has a low energy consumption.

Applications are known in which there is a need to perform signed MAC operations, i.e., MAC operations in which the input values $x_1, \ldots, x_N$ and/or the computational weights $g_{ij}$ may assume positive or negative values. Consequently, also the output values $y_1, \ldots, y_M$ may assume positive or negative values, as a function of the specific combination of input values and computational weights.

It is recognized that known approaches for performing signed MAC operations require a long elaboration time. Consequently, the number of signed MAC operations per second that may be carried out is low.

There is a need in the art to overcome the foregoing disadvantages.

SUMMARY

In an embodiment, an in-memory computation (IMC) device performs a multiply-and-accumulate (MAC) operation in response to receipt of an input signal indicative of a plurality of input values each having a respective sign and a respective absolute value, to provide at least one output signal. The IMC device comprises: a computation memory array comprising a plurality of groups of memory cells coupled to a bitline, each group of memory cells configured to store a respective computational weight and comprising a positive memory cell coupled to a respective positive wordline and a negative memory cells coupled to a respective negative wordline; and a row-activation circuit configured to receive the input signal and to provide, for each input value, during an effective elaboration interval, a positive-activation signal having a positive-activation duration to the positive wordline of a respective group of memory cells and a negative-activation signal having a negative-activation duration to the negative wordline of the respective group of memory cells, a sum of the positive-activation duration and the negative-activation duration being equal to a duration of the effective elaboration interval, the effective elaboration interval comprising a first elaboration phase and a second elaboration phase subsequent to the first elaboration phase.

The row-activation circuit is further configured, for each input value, to: determine a positive theoretical duration of the positive-activation signal and a negative theoretical duration of the negative-activation signal, wherein the positive theoretical duration and the negative theoretical duration are each an algebraic sum of a reference value that does not depend upon the input value and a variable value that varies as a function of the sign and the absolute value of the input value, so that the sum of the respective positive theoretical duration and the respective negative theoretical duration is equal to a theoretical elaboration duration; and provide first, during the effective elaboration interval, the positive-activation signal and the negative-activation signal whose theoretical durations are greater than or equal to the reference value, wherein the activation duration of one said positive-activation signal and the negative-activation signal being equal to the sum of an effective reference value, which is equal to the reference value reduced by a reduction factor, and the variable value, and wherein the activation duration of the other of said positive-activation signal and the negative-activation signal being equal to the respective theoretical duration.

The first elaboration phase of the effective elaboration interval has a duration equal to the effective reference value.

The positive memory cell of a respective group of memory cells is configured to be activated by the respective positive-activation signal and through which a positive-cell current flows when activated, and the negative memory cell of the respective group of memory cells is configured to be activated by the respective negative-activation signal and through which a negative-cell current flows when activated. For each group of memory cells, the positive-cell current and the negative-cell current are a function of the respective computational weight stored by the group of memory cells.

A bitline current flows through the bitline during the effective elaboration interval that is a function of a sum of the positive-cell currents and the negative-cell currents of the groups of memory cells coupled to the bitline. A column-elaboration circuit coupled to the bitline samples the bitline current and provides, in response thereto, the at least one output signal. The bitline current during the first elaboration phase is sampled as a function of the reduction factor.

In an embodiment, a method is presented for controlling an in-memory computation (IMC) device to perform a multiply-and-accumulate (MAC) operation. The method comprises: providing a computation memory array comprising a plurality of groups of memory cells coupled to a bitline; storing a respective computational weight having a sign and an absolute value in each group of memory cells, wherein each group of memory cells includes a positive memory cell coupled to a respective positive wordline and a negative memory cell coupled to a respective negative wordline; activating the positive memory cell by a respective positive-activation signal on the respective positive wordline; activating the negative memory cell by a respective negative-activation signal on the respective negative wordline; and flowing a respective positive-cell current by the respective positive memory cell for each group of memory cells in response to the respective positive-activation signal; flowing a respective negative-cell current by the respective negative memory cell for each group of memory cells in response to the respective negative-activation signal.

For each group of memory cells, the positive-cell current and the negative-cell current are a function of the respective computational weight.

The method further comprises providing, during an effective elaboration interval, in response to an input signal indicative of a plurality of input values each having a respective sign and a respective absolute value, for each input value, the positive-activation signal having a positive-activation duration to the positive wordline of a respective group of memory cells and the negative-activation signal having a negative-activation duration to the negative wordline of the respective group of memory cells. Providing the positive-activation signal and the negative-activation signal comprises: determining a positive theoretical duration of the positive-activation signal and a negative theoretical duration of the negative-activation signal; wherein the positive theoretical duration and the negative theoretical duration are each an algebraic sum of a reference value that does not depend upon the input value and a variable value that varies as a function of the sign and of the absolute value of the respective input value, so that a sum of the respective positive theoretical duration and the respective negative theoretical duration is equal to a theoretical elaboration duration; and providing first, during the effective elaboration interval, the positive-activation signal and the negative-activation signal, wherein one of the positive-activation signal and the negative-activation signal whose theoretical duration is greater than or equal to the reference value has an activation duration equal to a sum of an effective reference value equal to the reference value reduced by a reduction factor and the variable value, and the other of the positive-activation signal and the negative-activation signal has an activation duration equal to the respective theoretical duration.

The first elaboration phase of the effective elaboration interval has a duration equal to the effective reference value.

The method further comprises: flowing a bitline current through the bitline coupled to the groups of memory cells during the effective elaboration interval that is a function of the sum of the positive-cell currents and the negative-cell currents of the groups of memory cells coupled to the bitline; and sampling the bitline current during the first elaboration phase as a function of the reduction factor and providing, in response thereto, at least one output signal.

BRIEF DESCRIPTION OF THE DRAWINGS

For a better understanding of the present invention embodiments thereof are now described, purely by way of non-limiting example, with reference to the attached drawings, wherein:

FIG. 8 shows a table exemplifying possible charge values associated to each group of memory cells of the device of FIG. 1, in use;

FIG. 18 shows a table exemplifying possible charge values associated to each group of memory cells of the device of FIG. 1, in use.

DETAILED DESCRIPTION OF THE DRAWINGS

Figure 1:
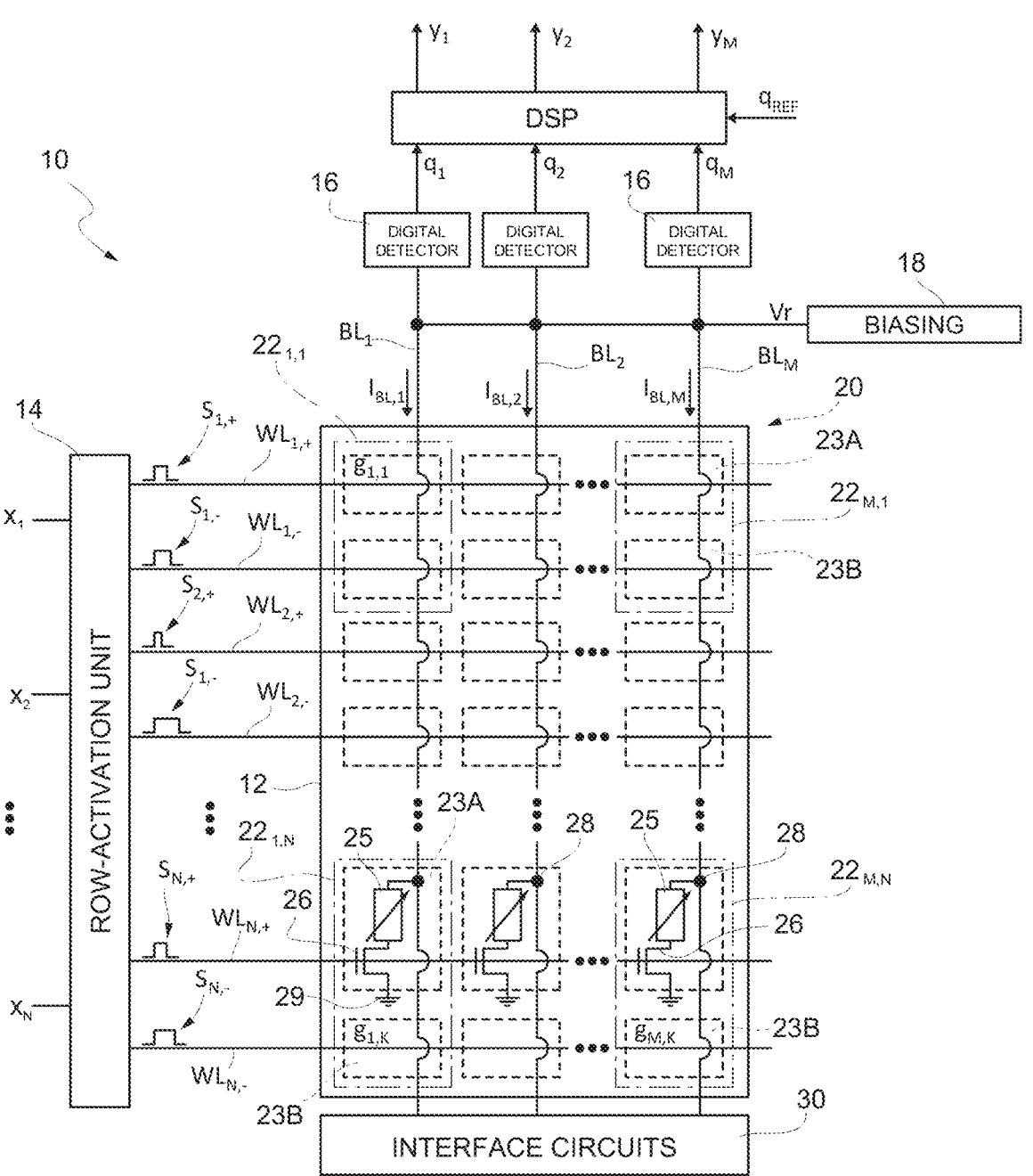
FIG. 1 shows a block diagram of an in-memory computation device.

FIG. 1 shows an in-memory computation device (hereinafter IMC device) 10 comprising a computation memory array (referred to hereinafter, for simplicity, also only as "memory array" or "computation array") 12, a row-activation unit or circuit 14, and an output elaboration circuit here comprising a plurality of digital detectors 16 and a digital signal processor (DSP) 17.

The memory array 12 comprises a plurality of memory cells 20 organized according to a matrix arrangement having M columns and K rows.

In what follows, a generic memory cell of the plurality of memory cells 20 is identified by reference 20$_{i,k}$, where the indices i=1, . . . , M and k=1, . . . , K indicate the column and the row, respectively, of the generic memory cell in the memory array 12.

In this embodiment, the memory cells 20 are of a non-volatile type.

The memory cells 20 are further organized so as to form a plurality of groups 22 of memory cells (identified by a dashed-and-dotted line in FIG. 1), each group 22 configured to store a respective computational weight G$_{ij}$.

In this embodiment, each computational weight G$_{ij}$ has a sign and an absolute value.

The computational weights G$_{ij}$ may be used as weights for executing an in-memory computation, in particular a signed MAC operation.

In this embodiment, each group 22 of memory cells is formed by a respective positive cell 23A and a respective negative cell 23B belonging to the plurality of memory cells 20.

In the arrangement of FIG. 1, the positive memory cell 23A and the negative memory cell 23B of each group 22 of memory cells are arranged on a same column i and on two adjacent rows k, k+1 of the memory array 12.

In practice, in this embodiment, the groups 22 of memory cells form an array having M columns and N rows, where N=K/2.

In what follows, a generic group 22 of memory cells of the plurality of groups 22 of memory cells is designated by reference 22$_{i,j}$, where the indices i=1, . . . , M and j=1, . . . , N indicate the column and the row, respectively, of the generic group 22$_{i,j}$ of memory cells.

The memory cells 20 that are arranged in a same column of the memory array 12 are mutually connected via a respective bitline BL$_i$, where i=1, . . . , M. The memory cells 20 arranged in the same row k of the memory array 12 are mutually connected via a respective wordline WL$_k$, where k=1, . . . , K.

In detail, each group 22$_{i,j}$ of memory cells is coupled to two adjacent wordlines WL$_k$, WL$_{k+1}$ that are identified hereinafter, respectively, as positive wordline WL$_{j,+}$ and negative wordline WL$_{j,-}$.

With reference to the arrangement of FIG. 1, the positive wordline WL$_{j,+}$ is coupled to the positive cells 23A of the groups 22$_{1,j}$, . . . , 22$_{M,j}$ of memory cells, and the negative wordline WL$_{j,-}$ is coupled to the negative cells 23B of the groups 22$_{1,j}$, . . . , 22$_{M,j}$ of memory cells.

For instance, the positive wordline WL$_{1,+}$ is coupled to all the memory cells 20 that are arranged on the row k=1 and on the columns from i=1 to i=M of the memory array 12. The negative wordline WL$_{1,-}$ is coupled to all the memory cells 20 that are arranged on the row k=2 and on the columns from i=1 to i=M of the memory array 12.

In practice, each group 22$_{i,j}$ of memory cells is coupled to a respective bitline BL$_i$ and to two respective wordlines WL$_{j,+}$, WL$_{j,-}$.

The row-activation unit 14 receives an input vector X indicative of a plurality of input values x$_1$, . . . , x$_N$. The input values x$_1$, . . . , x$_N$ each represent an input coefficient having a sign and an absolute value.

The input values x$_1$, . . . , x$_N$ may be the input data of a MAC operation.

The row-activation unit 14 provides, for each input value x$_j$, where j=1, . . . , N, a positive-activation signal S$_{j,+}$ to the respective positive wordline WL$_{j,+}$ and a negative-activation signal S$_{j,-}$ to the respective negative wordline WL$_{j,-}$.

In practice, the row-activation unit 14 provides the positive-activation signal S$_{j,+}$ to the positive cells 23A of the groups 22$_{1,j}$, . . . , 22$_{M,j}$ of memory cells and the negative-activation signal S$_{j,-}$ to the negative cells 23B of the groups 22$_{1,j}$, . . . , 22$_{M,j}$ of memory cells.

The row-activation unit 14 provides the positive-activation signal S$_{j,+}$ and the negative-activation signal S$_{j,-}$ during an effective elaboration interval T$_C$ that is determined by the row-activation unit 14 starting from a theoretical elaboration interval T*$_C$, as described in detail hereinafter.

The positive-activation signal S$_{j,+}$ activates the respective positive cells 23A, within the effective elaboration interval T$_C$, for a positive-activation duration T$_{j,+}$.

The negative-activation signal S$_{j,-}$ activates the respective negative cells 23B, within the effective elaboration interval T$_C$, for a negative-activation duration T$_{j,-}$.

The positive-activation duration T$_{j,+}$ and the negative-activation duration T$_{j,-}$ are a function of the sign and of the absolute value of the respective input value x$_j$, as described in detail hereinafter.

In detail, the positive-activation signal S$_{j,+}$ and the negative-activation signal S$_{j,-}$ are pulses, in particular here rectangular pulses, which each have a width (duration) equal to T$_{j,+}$ and T$_{j,-}$, respectively.

In this embodiment, the IMC device 10 also comprises a biasing circuit 18, which generates a biasing voltage Vr and provides the biasing voltage Vr to the bitlines BL$_1$, . . . , BL$_M$.

In the remainder of the description it is considered, for simplicity, that the biasing circuit 18 provides the same biasing voltage Vr to all the bitlines BL$_1$, . . . , BL$_M$. However, the biasing circuit 18 may provide to the bitlines BL$_1$, . . . , BL$_M$, starting from the biasing voltage Vr, biasing voltages different from one another, according to the specific application.

The digital detectors 16 are analog-to-digital converter (ADC) circuits that are each coupled to a respective bitline BL$_i$ and each provide a respective charge signal q$_i$ indicative of the current I$_{BL,i}$ that would flow through the respective bitline BL$_i$ if the elaboration interval were equal to the theoretical elaboration interval T*$_C$, as described in detail hereinafter with reference to FIG. 7.

In detail, each digital detector 16 may provide the respective charge signal q$_i$ starting from the integral of the bit current I$_{BL,i}$ in the effective elaboration interval T$_C$.

For instance, the digital detectors 16 may be formed by integration and sampling circuits in themselves known.

The digital processor 17 processes the charge signals q$_1$, . . . , q$_M$ and provides, in response, an output signal Y$_{MAC}$ indicative of a result of the MAC operation between the input vector X and the computational weights G$_{ij}$.

The output signal Y$_{MAC}$ is indicative of a plurality of output values y$_1$, . . . , y$_M$, here one for each bitline BL$_i$.

As described in detail hereinafter, the digital processor 17 may compare the charge signal q$_i$ with a reference-charge signal q$_{ref}$ and, in response to the comparison, provide the respective output value y$_i$. The sign and absolute value of the output value y$_i$ depend upon the comparison between the respective charge signal q$_i$ and the reference-charge signal q$_{ref}$.

The memory cells 20 each comprise a storage element 25 and a selection element 26.

The storage element 25 of each memory cell 20$_{i,k}$ is a variable resistive element that may be programmed to have a transconductance g$_{ik}$ chosen, during programming of the memory array 12, as a function of the computational weight $G_{i,j}$ of the respective group of cells $22_{i,j}$, as discussed in detail hereinafter.

In particular, the storage element 25 may be based upon a phase-change material (PCM), such as a chalcogenide.

A phase-change material has at least two phase states, for example an amorphous phase and a crystalline phase, where each phase may have one or more distinct values of resistivity.

A phase-change material may be converted from one phase state to another via heat transfer, for example using current pulses.

The resistance of each storage element 25 associated to the respective phase state is used to distinguish between two or more logic states of the corresponding memory cell 20.

For instance, the amorphous phase may have a higher resistance (and thus a lower transconductance) than does the crystalline phase.

A logic state '0', or reset state, may be associated, for example, to the amorphous phase of the storage element 25. A logic state '1', or set state, may be associated to the crystalline phase of the storage element 25.

In this embodiment, the memory cells 20 are multilevel cells; i.e., they may be programmed so as to represent a number of logic states greater than two.

In other words, each memory cell $20_{i,k}$ may be programmed so that the respective transconductance $g_{i,k}$ may assume a value chosen from among three or more values.

Purely by way of example, in what follows it is considered that the transconductance $g_{i,k}$ of each memory cell $20_{i,k}$ may be chosen as one of three distinct transconductance values $g_1$, $g_2$, and $g_3$, where $g_1 < g_2 < g_3$.

The storage element 25 has a first terminal coupled to a node 28 of the respective bitline $BL_i$ and a second terminal coupled to a reference-potential node, here ground 29, via the selection element 26.

The selection element 26 is a switch, for example a BJT, a diode, or a MOS transistor, here an NMOS transistor, which is arranged in series to the respective storage element 25 and switching of which is controlled by the activation signal $S_{j,+}$ or $S_{j,-}$ of the respective wordline $WL_{j,+}$ or $WL_{j,-}$.

In this embodiment, the NMOS transistor forming the selection element 26 has: a source terminal coupled, here directly connected, to ground 29; a drain terminal coupled, here directly connected, to a second terminal of the storage element 25; and a gate terminal coupled, here directly connected, to the respective wordline $WL_{j,+}$ or $WL_{j,-}$.

In practice, the storage element 25 and the selection element 26 form a current path of the respective memory cell 20.

Figures 2, 3:
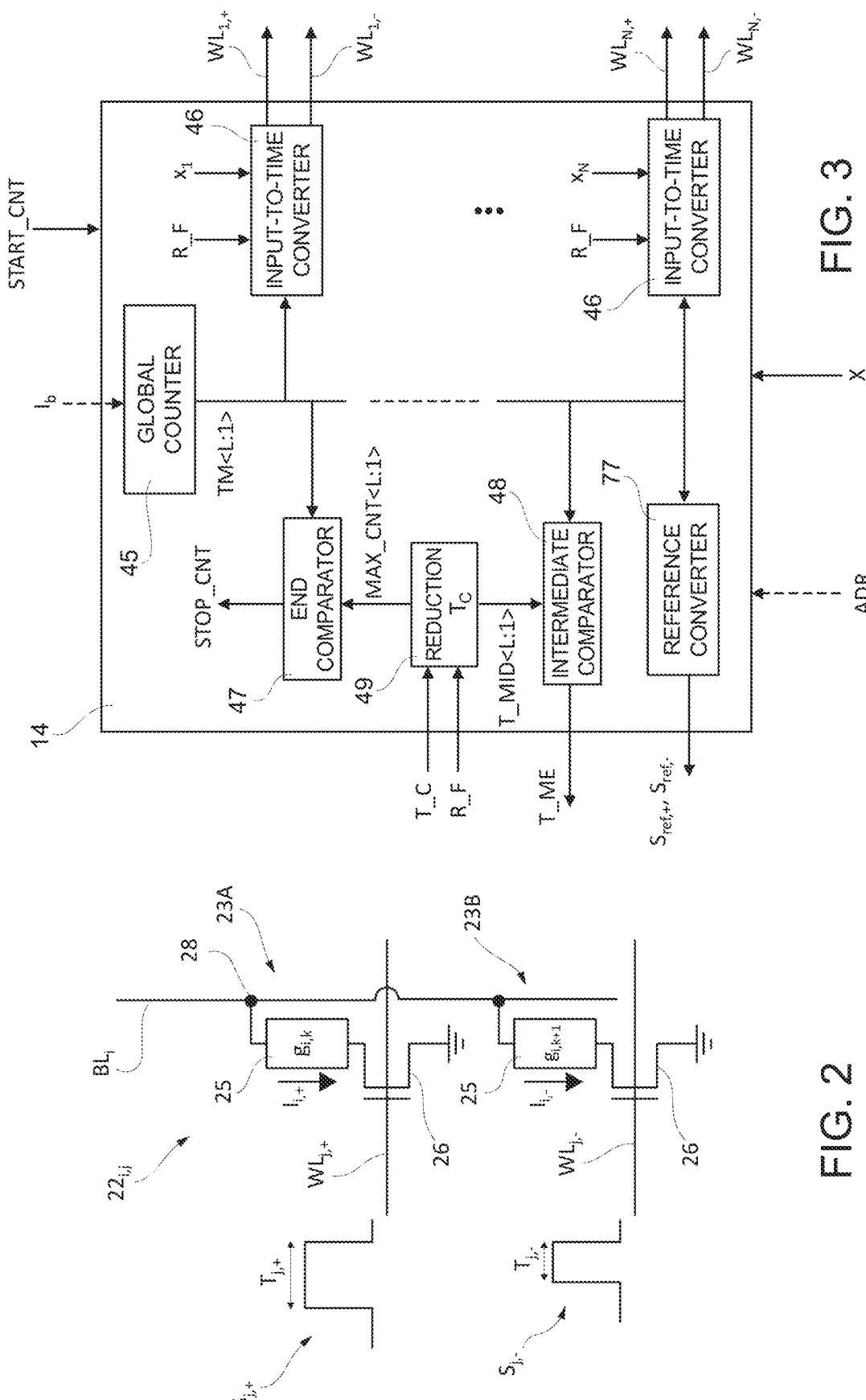
FIG. 2 shows a detailed circuit diagram of a group of memory cells of the device of FIG. 1.
FIG. 3 shows a block diagram of a row-activation circuit of the device of FIG. 1.

With reference to a generic group $22_{i,j}$ of memory cells illustrated in detail in FIG. 2, the selection element 26 of the positive cell 23A, in response to reception of the respective positive-activation signal $S_{j,+}$, closes the respective current path, thereby enabling passage of a positive-cell current $I^+_{i,j}$ from the common node 28 to ground 29, for a time interval that depends upon the positive-activation duration $T_{j,+}$, in particular here equal to the positive-activation duration $T_{j,+}$.

The selection element 26 of the negative cell 23B, in response to reception of the respective negative-activation signal $S_{j,-}$, closes the respective current path, thus enabling passage of a negative-cell current $I^-_{i,j}$ from the common node 28 to ground 29, for a time interval that depends upon the negative-activation duration $T_{j,-}$, in particular here equal to the negative-activation duration $T_{j,-}$.

For each group $22_{i,j}$ of memory cells, the negative-cell current $I^-_{i,j}$ and the positive-cell current $I^+_{i,j}$ are chosen as a function of the respective computational weight $G_{i,j}$, according to the specific application.

In this embodiment, the positive cell 23A and the negative cell 23B of the generic group $22_{i,j}$ of memory cells are programmed so that the linear combination of the positive-cell current $I^+_{i,j}$ and of the negative-cell current $I^-_{i,j}$ is equal to a total current $I_{tot}$.

In particular, in this embodiment, $I^+_{i,j} + I^-_{i,j} = I_{tot}$.

The total current $I_{tot}$ may be chosen by a user according to the specific application of the IMC device 10 and/or to the specific characteristics of the memory array 12.

In this embodiment, the total current $I_{tot}$ is the same for all the groups 22 of memory cells.

The positive cell 23A and the negative cell 23B of the generic group $22_{i,j}$ of memory cells are further programmed so that the difference between the positive-cell current $I^+_{i,j}$ and the negative-cell current $I^-_{i,j}$ is a function of the sign and of the absolute value of the respective computational weight $G_{i,j}$.

In detail, the positive-cell current $I^+_{i,j}$ and the negative-cell current $I^-_{i,j}$ may be chosen based on a reference current $I_{ref}$ lower than the total current $I_{tot}$.

In this embodiment, the reference current $I_{ref}$ is equal to one half of the total current $I_{tot}$; i.e., $I_{ref} = I_{tot}/2$.

In greater detail, the positive-cell current $I^+_{i,j}$ and the negative-cell current $I^-_{i,j}$ are chosen so that the difference between the positive-cell current $I^+_{i,j}$ and the reference current $I_{ref}$ is a function of the sign and of the absolute value of the respective computational weight $G_{i,j}$.

The sign of the difference between the positive-cell current $I^+_{i,j}$ and the reference current $I_{ref}$ depends upon the sign of the computational weight $G_{i,j}$.

The absolute value of the difference between the positive-cell current $I^+_{i,j}$ and the reference current $I_{ref}$ depends upon the absolute value of the computational weight $G_{i,j}$.

In this embodiment:

if $G_{i,j} > 0$, then $I^+_{i,j} > I_{ref}$;

if $G_{i,j} = 0$, then $I^+_{i,j} = I_{ref}$; and if $G_{i,j} < 0$, then $I^+_{i,j} < I_{ref}$.

The absolute value $|I^+_{i,j} - I_{ref}|$ of the difference between the positive-cell current $I^+_{i,j}$ and the reference current $I_{ref}$ is a function of the absolute value $|G_{i,j}|$ of the value of computational weight $G_{i,j}$.

The absolute value $|I^+_{i,j} - I_{ref}|$ may be a monotonic function, for example an increasing monotonic function, of the absolute value $|G_{i,j}|$ of the value of computational weight $G_{i,j}$.

Purely by way of explanatory numeric example, assuming that the currents $I^+_{i,j}$, $I^-_{i,j}$ may each assume a value equal to 0 µA, 1 µA or 2 µA, that $I_{tot} = 2$ µA and $I_{ref} = I_{tot}/2 = 1$ µA, the computational weight $G_{i,j}$ may be represented by:

if $G_{i,j} = +1$, then $I^+_{i,j} = 2$ µA and $I^-_{i,j} = 0$ µA;

if $G_{i,j} = 0$, then $I^+_{i,j} = 1$ µA and $I^-_{i,j} = 1$ µA; and if $G_{i,j} = -1$, then $I^+_{i,j} = 0$ µA and $I^-_{i,j} = 2$ µA.

In practice, for each group $22_{i,j}$ of memory cells, the sign of the difference $I^+_{i,j} - I^-_{i,j}$ between the respective positive-cell current $I^+_{i,j}$ and the respective negative-cell current $I^-_{i,j}$ may be a function of the sign and not of the absolute value of the respective computational weight $G_{i,j}$. In other words, if $G_{i,j} > 0$, then $I^+_{i,j} - I^-_{i,j} > 0$, if $G_{i,j} < 0$, then $I^+_{i,j} - I^-_{i,j} < 0$, and if $G_{i,j} = 0$, then $I^+_{i,j} - I^-_{i,j} = 0$.

The absolute value of the difference $I^+_{i,j} - I^-_{i,j}$ between the respective positive-cell current $I^+_{i,j}$ and the respective negative-cell current $I^-_{i,j}$ may be a function of the absolute value and not of the sign of the respective computational weight $G_{i,j}$.

In detail, in this embodiment, for each group $22_{i,j}$ of memory cells, the difference $I^+_{i,j}-I^-_{i,j}$ between the respective positive-cell current $I^+_{i,j}$ and the respective negative-cell current $I^-_{i,j}$ is a monotonic function, in particular an increasing monotonic function, of the respective computational weight $G_{i,j}$.

The IMC device 10 may further comprise interface circuits 30, which include row-decoding and selection circuits, column-decoding and selection circuits, and read/write circuits that are useful for operation of the IMC device 10 and are in themselves known. For instance, the read/write circuits may be used for programming the value of transconductance of the memory cells 20.

With reference to FIG. 3, the row-activation unit 14 comprises a plurality of input-to-time converters 46, one for each input value $x_1, \ldots, x_N$, and a timing circuit, which here includes a global timer or counter 45, an end comparator 47, an intermediate comparator 48, and an interval-reduction circuit 49.

Figure 6B:
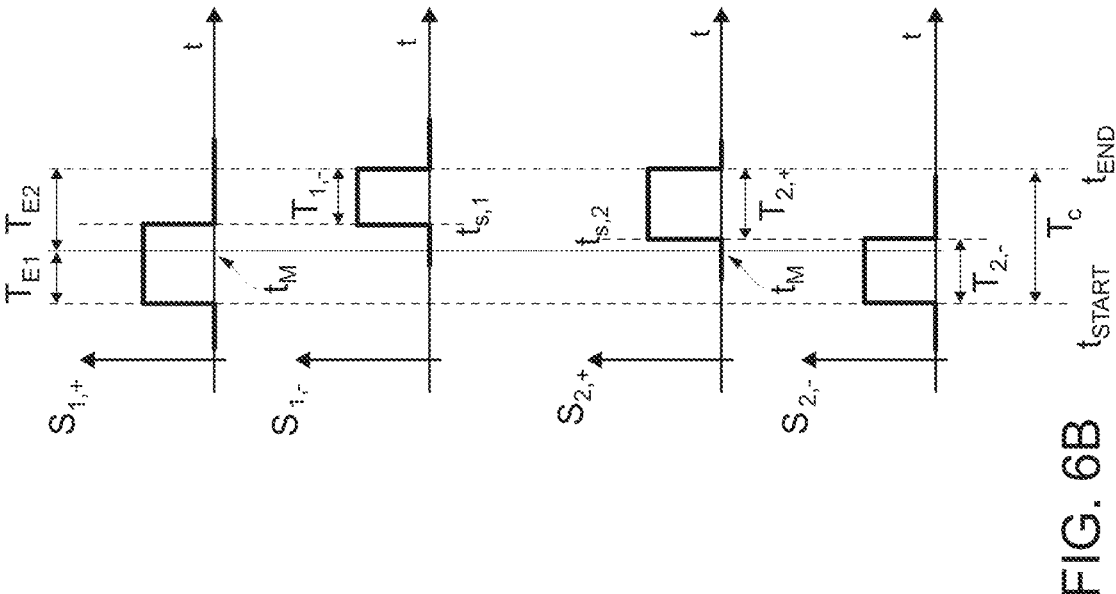
FIG. 6B shows waveforms exemplifying effective row-activation signals that are generated by the circuit of FIG. 5 starting from the theoretical signals of FIG. 6A, in use.
Figure 10:
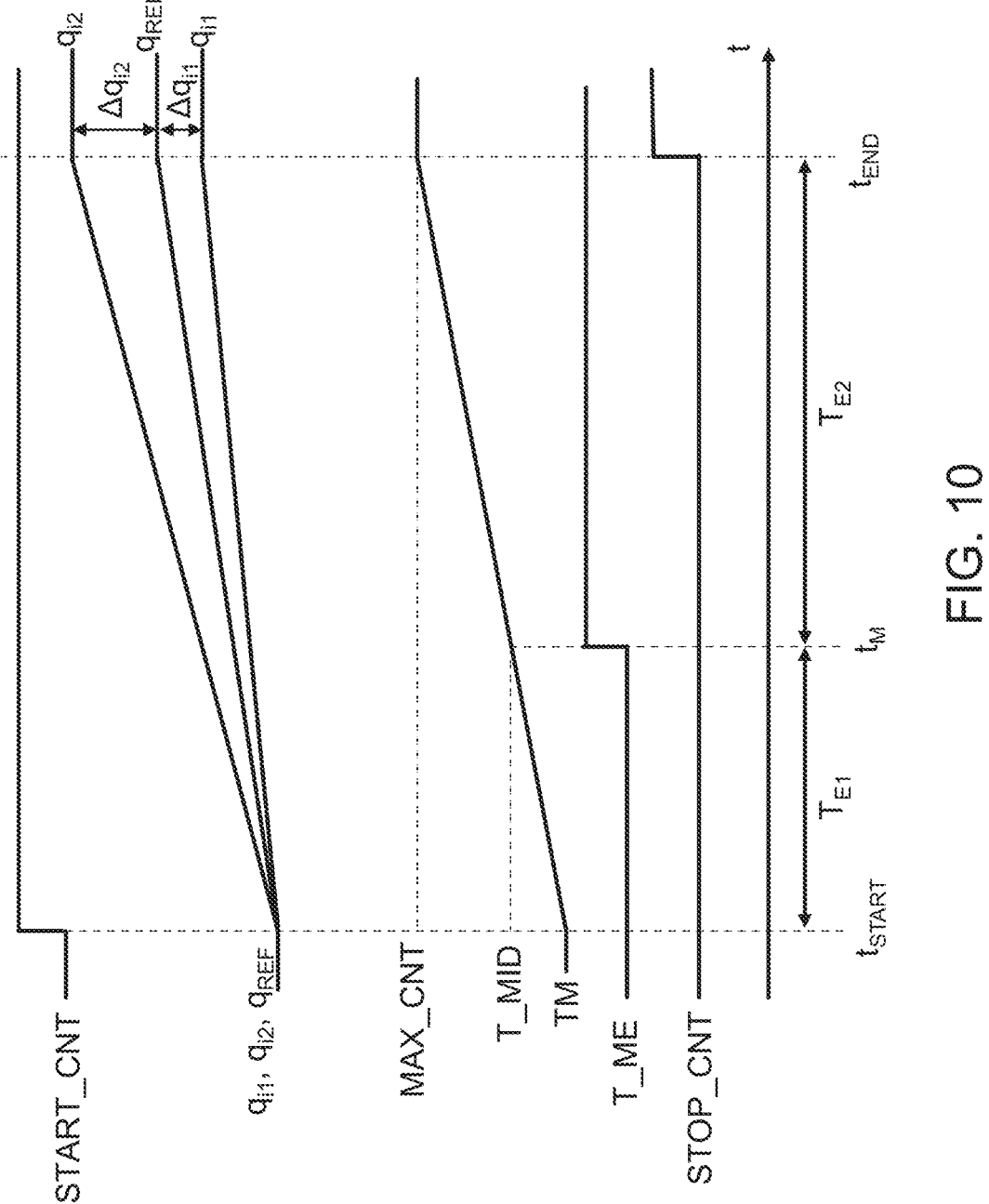
FIG. 10 shows waveforms exemplifying the device of FIG. 1, in use.

The timer 45 provides a timing signal TM defining the effective elaboration interval $T_C$ that extends between a start instant $t_{start}$ and an end instant tend (as illustrated for example in FIGS. 6B and 10).

The effective elaboration interval $T_C$ is formed by a first effective elaboration phase $T_{E1}$, having a duration $T_{E1}$, and a second effective elaboration phase $T_{E2}$, having a duration $T_{E2}$, such that $T_{E1}+T_{E2}=T_C$.

In particular, in this embodiment, $T_{E1}<T_{E2}$.

The second effective elaboration phase $T_{E2}$ follows, in particular is directly consecutive to, the first effective elaboration phase $T_{E1}$.

The row-activation unit 14 receives, for example from an external user of the IMC device 10, a start-of-computation signal START_CNT that determines the start instant $t_{start}$ and thus the start of the effective elaboration interval $T_C$. For instance, the start-of-computation signal START_CNT may be a step logic signal, whose rising edge determines the start instant $t_{start}$ (FIG. 10).

The timing signal TM may be an analog or digital signal, here an L-bit digital signal, denoted in what follows and in the figures also as timing signal TM<L:1>, increasing in time.

The timer 45 may reset the timer signal TM to a start value, for example to zero, at the start of a new elaboration operation, namely, at the start instant $t_{start}$.

The timer 45 increments the timing signal TM, for example in a monotonic way, in particular a strictly monotonic way, increasing in time, starting from the start value at the instant $t_{start}$ up to an end value at the instant tend.

The timer 45 increments the timing signal TM at an update frequency $f_u$ that depends upon the specific implementation of the timer 45 and that may be chosen by a user of the IMC device 10 according to the specific application and the specific implementation of the timer 45.

In practice, the timer signal TM is a counter signal.

The interval-reduction circuit 49 receives an elaboration-duration signal T_C, which is indicative of the theoretical elaboration interval $T^*_C$ having a theoretical elaboration duration (once again denoted by $T^*_C$), and a reduction signal R_F, which is indicative of a factor of reduction RF of the theoretical elaboration duration $T^*_C$.

The theoretical elaboration interval $T^*_C$ is formed by a first theoretical elaboration phase $T^*_{E1}$, having a duration $T^*_{E1}$, and a second theoretical elaboration phase $T^*_{E2}$, having a duration $T^*_{E2}$, such that $T^*_{E1}+T^*_{E2}=T^*_C$.

In particular, in this embodiment, $T^*_{E1}=T^*_{E2}=T^*_C/2$.

The theoretical elaboration duration $T^*_C$ may be chosen by a user according to the specific application; for example, it may be of the order of some hundreds of nanoseconds or less than about 100 ns.

The reduction factor RF may be chosen by a user according to the specific application; for example, it may be an integer factor, in particular 2 or 4.

The effective elaboration duration $T_C$ is a function of the theoretical elaboration duration $T^*_C$ and of the reduction factor RF, as described in detail hereinafter.

The theoretical elaboration duration $T^*_C$ and the reduction factor RF may be set by a user of the IMC device 10 before the start ($t_{start}$) of the effective elaboration interval $T_C$, for example in a step of calibration or initialization of the IMC device 10. Consequently, also the effective elaboration interval $T_C$ is fixed.

The interval-reduction circuit 49 provides, starting from the elaboration-duration signal T_C and the reduction signal R_F, a maximum-count signal MAX_CNT and an intermediate-count signal T_MID.

In detail, in this embodiment, the reduction signal R_F indicates the reduction of the first theoretical elaboration phase $T^*_{E1}$.

In practice, the reduction circuit 49 determines the duration $T_C$ of the effective elaboration interval $T_C$ starting from the theoretical elaboration duration $T^*_C$, as a function of the reduction factor RF.

In this embodiment, $T_{E1}=T^*_{E1}/RF=T^*_C/2/RF$ and $T_{E2}=T^*_{E2}=T_C^*/2$. In other words, $T_C=T^*_{E1}/RF+T^*_{E2}$.

The maximum-count signal MAX_CNT is indicative of the end instant tend of the effective elaboration interval $T_C$, i.e., of the duration $T_C$ of the effective elaboration interval $T_C$.

The intermediate-count signal T_MID is indicative of a separation instant ty within the effective elaboration interval $T_C$, such that $tm-t_{start}=T_{E1}$.

The intermediate comparator 48 compares the timing signal TM with the intermediate-count signal T_MID and provides, in response, a signal T_ME, for example a step logic signal (FIG. 10).

When the timing signal TM becomes equal to the intermediate-count signal T_MID (separation instant tm), the signal T_ME switches, in particular here to the high logic value, thus marking the end of the first elaboration phase $T_{E1}$ and the start of the second elaboration phase $T_{E2}$ (FIGS. 6B and 10).

The end comparator 47 compares the timing signal TM with the maximum-count signal MAX_CNT and provides, in response, an end-of-elaboration signal STOP_CNT, for example a step logic signal.

When the timing signal TM becomes equal to the maximum-count signal MAX_CNT, the end-of-count signal STOP_CNT switches, in particular here to the high logic value, thus determining the end instant tend (FIG. 10).

For instance, the end comparator 47 and the intermediate comparator 48 may be bit-verification circuits based upon XOR logic gate.

The input-to-time converters 46 each receive a respective input value $x_j$ and provide, within the effective elaboration interval $T_C$, the positive-activation signal $S_{j,+}$ and the negative-activation signal $S_{j,-}$ as a function of the respective input value $x_j$.

Figure 4:
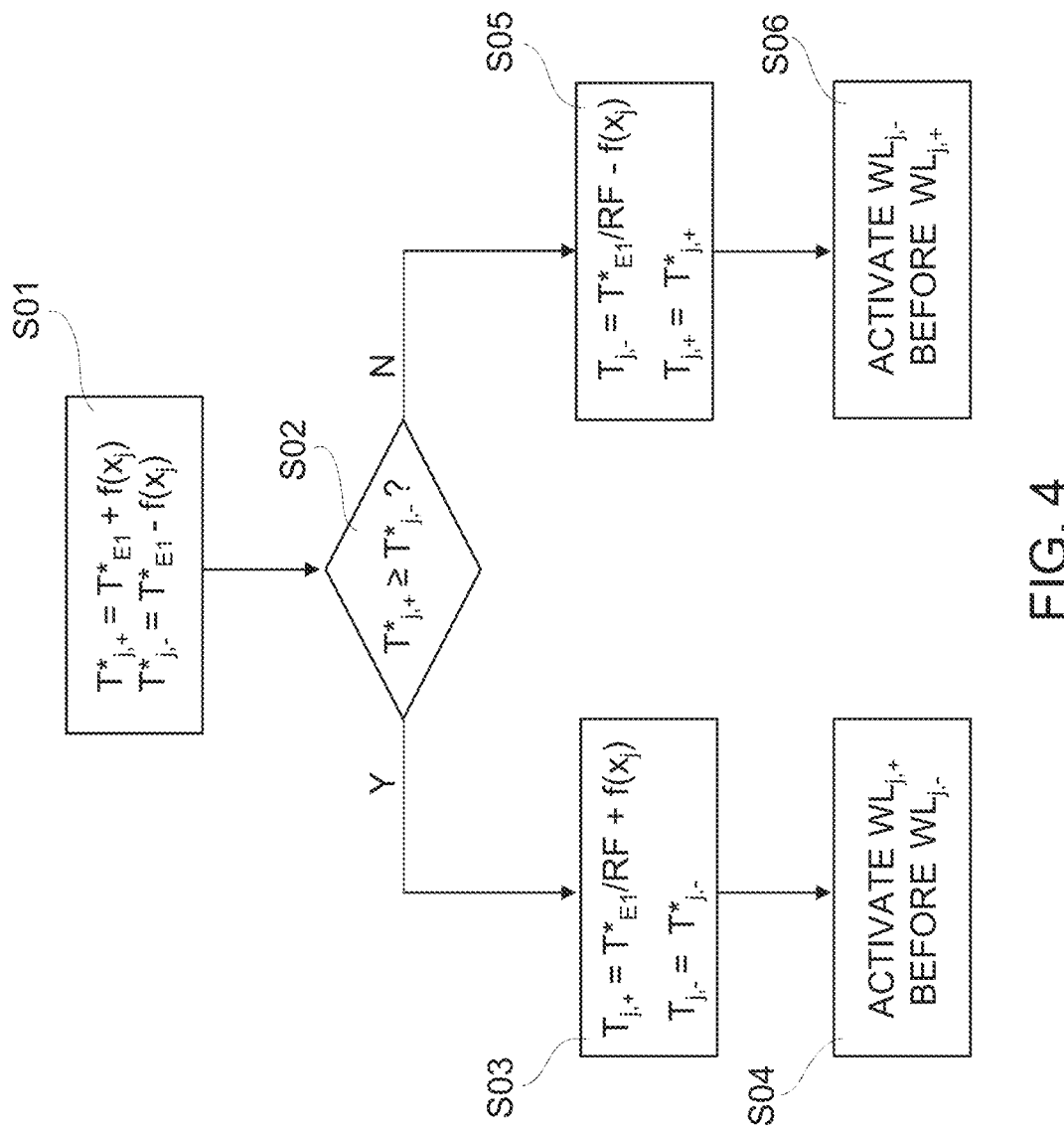
FIG. 4 shows a flowchart of a method implemented by the circuit of FIG. 3 for controlling activation of the wordlines of the device of FIG. 1.

In detail, as illustrated in the flowchart of FIG. 4, each input-to-time converter 46 first determines, in step S01, a respective positive theoretical duration $T^*_{j,+}$ and a respective negative theoretical duration $T^*_{j,-}$ so that the sum of the positive theoretical duration $T^*_{j,+}$ and the negative theoretical duration $T^*_{j,-}$ is equal to the theoretical elaboration duration $T^*_C$, i.e., $T^*_{j,+}+T^*_{j,-}=T^*_C$; and so that the difference between the positive theoretical duration $T^*_{j,+}$ and the negative theoretical duration $T_{j,-}$ is a function of the sign and of the absolute value of the respective input value $x_j$.

In detail, the positive theoretical duration $T^*_{j,+}$ and the negative theoretical duration $T^*_{j,-}$ are chosen on the basis of a reference duration that is less than the theoretical elaboration duration $T^*_C$ and is here equal to the duration of the first elaboration phase $T^*_{E1}$ (i.e., $T^*_C/2$), so that the difference between the positive theoretical duration $T^*_{j,+}$ and the reference duration $T^*_{E1}$ is a function $f(x_j)$ of the input value $x_j$.

In practice, $T^*_{j,+}=T^*_{E1}+f(x_j)$ and $T^*_{j,-}=T^*_{E1}-f(x_j)$.

In other words, the positive theoretical duration $T^*_{j,+}$ and the negative theoretical duration $T^*_{j,-}$ are given by the algebraic sum of a reference value ($T^*_{E1}$, here equal to $T^*_C/2$), which is constant and does not depend upon the respective input value $x_j$, and a variable value (the function $f(x_j)$), which depends upon the respective input value.

The sign of the function $f(x_j)$ may depend upon the sign and/or upon the absolute value of the input value $x_j$.

The absolute value of the function $f(x_j)$ may depend upon the sign and/or upon the absolute value of the input value $x_j$.

In particular, the sign of the function $f(x_j)$ may depend only upon the sign of the input value $x_j$, and the absolute value of the function $f(x_j)$ may depend only upon the absolute value of the input value $x_j$.

According to one embodiment:

if $x_j=0$, then $f(x_j)=0$, i.e., $T^*_{j,+}=T^*_{j,-}=T^*_{E1}$;

if $x_j>0$, then $f(x_j)>0$, i.e., $T^*_{j,+}>T^*_{E1}$ and $T^*_{j,-}<T^*_{E1}$; and if $x_j<0$, then $f(x_j)<0$, i.e., $T^*_{j,+}<T^*_{E1}$ and $T^*_{j,-}>T^*_{E1}$.

In detail, the function $f(x_j)$ may be a monotonic function, for example an increasing monotonic function, of the input value $x_j$.

The absolute value $|T^*_{j,+}-T^*_{E1}|$ may have a linear or nonlinear dependence upon the absolute value $|x_j|$ of the input value $x_j$.

In this embodiment, the absolute value $|T^*_{j,+}-T^*_{E1}|$ has a linear dependence, in particular it is directly proportional, to the absolute value $|x_j|$ of the input value $x_j$, i.e., $|T^*_{j,+}-T^*_{E1}|=p \cdot |x_j|$.

Further, in this embodiment the proportionality factor $p$ between $|T^*_{j,+}-T^*_{E1}|$ and $|x_j|$ is the same both if the input value $x_j$ is positive and if the input value $x_j$ is negative. However, the relation between $|T^*_{j,+}-T^*_{E1}|$ and $|x_j|$ may have a proportionality factor $p_+$ if $x_j>0$ and a proportionality factor $p_-$ if $x_j<0$, where $p_+$ is different from $p_-$.

Purely by way of example, considering a theoretical elaboration duration $T^*_C=128$ ns (and, thus, $T_{E1}=T_{E2}=T^*_o/2=64$ ns) and considering that the input value $x_j$ may be comprised between $-64$ and $+64$:

if $x_j=-64$, then $T^*_{j,+}=0$ ns and $T^*_{j,-}=128$ ns, i.e., $T^*_{j,+}-T^*_o/2=-64$;

if $x_j=-32$, then $T^*_{j,+}=32$ ns and $T^*_{j,-}=96$ ns, i.e., $T^*_{j,+}-T^*_o/2=-32$;

if $x_j=0$, then $T^*_{j,+}=64$ ns and $T^*_{j,-}=64$ ns, i.e., $T^*_{j,+}-T^*_o/2=0$;

if $x_j=+32$, then $T^*_{j,+}=96$ ns and $T^*_{j,-}=32$ ns, i.e., $T^*_{j,+}-T^*_o/2=32$; and if $x_j=+64$, then $T^*_{j,+}=128$ ns and $T^*_{j,-}=0$ ns, i.e., $T^*_{j,+}-T^*_o/2=64$.

Then, step S02, the input-to-time converter 46 compares the positive theoretical duration $T^*_{j,+}$ with the negative theoretical duration $T^*_{j,-}$.

If the positive theoretical duration $T^*_{j,+}$ is greater than or equal to the negative theoretical duration $T^*_{j,-}$ (branch Y at output from step S02), then the positive elaboration duration $T_{j,+}$ is obtained, step S03, by reducing the positive theoretical duration $T^*_{j,+}$ as a function of the reduction factor RF. For instance, in this embodiment, $T_{j,+}=T^*_{E1}/RF+f(x_j)$. The negative elaboration duration $T_{j,-}$ remains equal to the negative theoretical duration $T^*_{j,-}$; i.e., $T_{j,-}=T^*_{j,-}=T^*_{E1}-f(x_j)$.

In this case, step S04, during the effective elaboration interval $T_C$, the positive wordline $WL_{j,+}$ is activated before the negative wordline $WL_{j,-}$.

If the positive theoretical duration $T^*_{j,+}$ is less than the negative theoretical duration $T^*_{j,-}$ (branch N at output from step S02), then the negative elaboration duration $T_{j,-}$ is obtained, step S05, by reducing the negative theoretical duration $T^*_{j,-}$ as a function of the reduction factor RF. For instance, in this embodiment, $T_{j,-}=T^*_{E1}/RF-f(x_j)$. The positive elaboration duration $T_{j,+}$ remains equal to the positive theoretical duration $T^*_{j,+}$; i.e., $T_{j,+}=T^*_{j,+}=T^*_{E1}+f(x_j)$.

In this case, step S06, during the effective elaboration interval $T_C$, the negative wordline $WL_{j,-}$ is activated before the positive wordline $WL_{j,+}$.

In other words, in use, during the effective elaboration interval $T_C$, of the positive-activation signal $S_{j,+}$ and the negative-activation signal $S_{j,-}$, it is provided, as first activation signal, the activation signal whose theoretical duration is greater than or equal to the reference value (here $T^*_C/2$).

Furthermore, the activation duration of said first activation signal is given by the sum of an effective reference value (here $T^*_C/2/RF$), which is equal to the reference value (here $T^*_C/2$) reduced by the reduction factor RF and by the variable value ($f(x_1)$, $f(x_2)$). The activation duration of the other activation signal remains instead equal to the respective theoretical duration.

Hereinafter, a generic input-to-time converter 46 is described in detail with reference to the embodiment of FIG. 5.

The input-to-time converter 46 comprises a register 50 that receives the input value $x_j$ and provides a sign signal SGN indicative of the sign (+ or −) of the input value $x_j$, and an absolute-value signal MOD indicative of the absolute value of the input value $x_j$. For instance, the sign signal SGN may assume the value '0' if $x_j \geq 0$ and '1' if $x_j < 0$.

A logic block 51 receives the sign signal SGN, the absolute-value signal MOD, and the reduction signal R_F and provides, in response, a signal WL_DATA, here of a digital type, which is configured to set the positive-activation duration $T_{j,+}$ and the negative-activation duration $T_{j,-}$ as a function of the sign and of the absolute value of the input value $x_j$, as discussed with reference to FIG. 4.

In practice, the register 50 and the logic block 51 are configured to implement what is discussed with reference to steps S01, S02, S03, and S05 of the flowchart of FIG. 4.

The signal WL_DATA is indicative of one of the values that the timing signal TM assumes between the instants $t_{start}$ and $t_{end}$.

For instance, the value indicated by the signal WL_DATA may be obtained from a specific conversion table (or look-up table) implemented by the logic block 51 and by the register 50.

In detail, the switching signal WL_DATA is indicative of a switching instant $t_{s,j}$ arranged within the effective elaboration interval $T_C$, i.e., between the start instant $t_{start}$ and the end instant $t_{end}$.

For instance, in what follows it is considered, for simplicity and without this implying any loss of generality, that $t_{start}=0$. Consequently, $t_{end}=T_C$.

In this embodiment, the logic block 51 is configured so that the signal WL_DATA indicates the switching instant $t_{s,j}$ that is associated to the greater between the positive theoretical duration $T^*_{j,+}$ and the negative theoretical duration $T^*_{j,-}$.

For instance, if $x_j > 0$, the switching instant $t_{s,j}$ may be chosen as a function of the positive theoretical duration $T^*_{j,+}$ so that $t_{s,j} - t_{start} = T_{j,+}$.

A comparator 52 compares the signal WL_DATA with the timing signal TM and provides, in response, a switching signal SWITCH_WL. For instance, the comparator 52 may be a bit-verification circuit based upon XOR logic gate.

The switching signal SWITCH_WL may, for example, have the high logic value as long as the timing signal TM is different from the signal WL_DATA. When the signal WL_DATA becomes equal to the timing signal TM (switching instant $t_{s,j}$), the comparator 52 switches the switching signal SWITCH_WL.

A set-reset latch 53 receives at the set input S the switching signal SWITCH_WL and the end-of-count signal STOP_CNT at the reset input R.

A set-reset latch 54 receives at the set input S the start-of-count signal START_CNT and the end-of-count signal STOP_CNT at the reset input R, and provides at the Q output a row-enable signal EN_WL.

In practice, the row-enable signal EN_WL may have the high logic value during the effective elaboration interval $T_C$, i.e., from the start instant $t_{start}$ up to the end instant $t_{end}$.

An XOR logic gate 55 has a first input coupled to the Q output of the latch 53 and a second input on which it receives the sign signal SGN provided by the register 50. The XOR logic gate 55 provides at output a row-selection signal SEL_WL.

A first AND logic gate 56A receives at input the selection signal SEL_WL and the enable signal EN_WL and is coupled at output to a first row driver 58A, for example a buffer, which provides the positive-activation signal $S_{j,+}$ to the respective wordline $WL_{j,+}$.

An inverter 57 receives the selection signal SEL_WL and provides a negated selection signal SEL_WL_N.

A second AND logic gate 56B receives at input the negated selection signal SEL_WL_N and the enable signal EN_WL and is coupled at output to a second row driver 58B, for example a buffer, which provides the negative-activation signal $S_{j,-}$ to the respective wordline $WL_{j,-}$.

In practice, during the effective elaboration interval $T_C$, there is first asserted, i.e., from the start instant $t_{start}$ up to the switching instant $t_{s,j}$, the activation signal to which a longer theoretical duration is associated; the other activation signal is asserted subsequently, i.e., from the switching instant $t_{s,j}$ up to the end instant $t_{end}$.

Figure 6A:
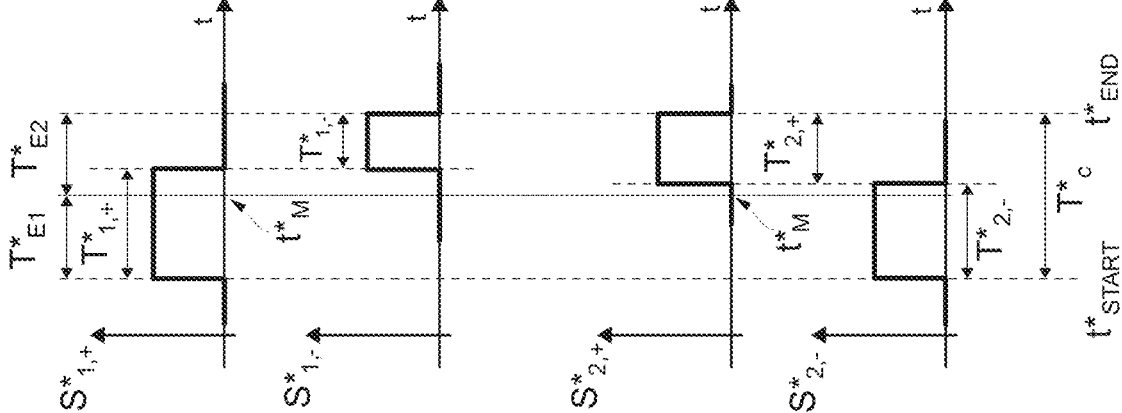
FIG. 6A shows waveforms exemplifying theoretical row-activation signals that are determined by the circuit of FIG. 5.

Purely by way of example, FIGS. 6A and 6B show the theoretical durations $T^*_{1,+}$, $T^*_{1,-}$ and, respectively, the effective durations $T_{1,+}$, $T_{1,-}$ associated to the first input value $x_1$, and the theoretical durations $T^*_{2,+}$, $T^*_{2,-}$ and, respectively, the effective durations $T_{2,+}$, $T_{2,-}$ associated to the second input value $x_2$, in an example where $x_1 > 0$, $x_2 < 0$ and $|x_2| < |x_1|$.

In FIG. 6A, the theoretical activation signals associated to the first and second input values $x_1$, $x_2$, respectively, are denoted by an asterisk, to differentiate them from the effective activation signals of FIG. 6B that are generated by the input-to-time converters 46 for activation of the respective wordlines.

With reference to FIG. 6A, the first elaboration phase $T^*_{E1}$ and the second elaboration phase $T^*_{E2}$ of the theoretical elaboration interval $T^*_C$ have the same duration, i.e., $T^*_{E1} = T^*_{E2} = T^*_M = T^*_C/2$. A theoretical separation instant $t^*_M$, identified by a dotted line in FIG. 6A, indicates the separation between the first and second phases $T^*_{E1}$, $T^*_{E2}$ of the theoretical elaboration interval $T^*_C$.

Since $x_1 > 0$, the positive theoretical duration $T^*_{1,+}$ is greater than the reference duration $T^*_C/2$ ($T^*_{1,+} - T^*_C/2 > 0$).

Furthermore, since $T^*_{1,+} + T^*_{1,-} = T^*_C$, the positive theoretical duration $T^*_{1,+}$ is greater than the negative theoretical duration $T^*_{1,-}$. In practice, $T^*_{1,+} - T^*_{1,-} > 0$.

Since $x_2 < 0$, the positive theoretical duration $T^*_{2,+}$ is less than the reference duration $T_C/2$ ($T^*_{2,+} - T^*_C/2 < 0$).

Furthermore, since $T^*_{2,+} + T^*_{2,-} = T^*_C$, the positive theoretical duration $T^*_{2,+}$ is less than the negative theoretical duration $T^*_{2,-}$. In practice, $T^*_{2,+} - T^*_{2,-} < 0$.

In the example of FIG. 6A, since $|x_2| < |x_1|$, it is $|T^*_{2,-} - T^*_C/2| < |T^*_{1,+} - T^*_C/2|$, i.e., $T^*_{2,-} < T^*_{1,+}$.

With reference to FIG. 6B, the first elaboration phase $T_{E1}$ and the second elaboration phase $T_{E2}$ of the effective elaboration interval $T_C$ have durations different from one another, in particular $T_{E1} < T_{E2}$, for example here RF=2, i.e., $T_{E1} = T_{E2}/2$.

As regards the first input value $x_1$, since $T_{1,+} > T_{1,-}$, the positive-activation signal $S_{1,+}$ is provided before the negative-activation signal $S_{1,-}$. Consequently, the positive-activation duration $T_{1,+}$ is less than the positive theoretical duration $T^*_{1,+}$, in particular here $T_{1,+} = T_C/2/2 + f(x_1)$, whereas the negative-activation duration $T_{1,-}$ is equal to the negative theoretical duration $T^*_{1,-}$.

As regards the second input value $x_2$, since $T_{2,+} < T_{2,-}$, the negative-activation signal $S_{2,-}$ is provided before the positive-activation signal $S_{2,+}$. Consequently, the negative-activation duration $T_{2,-}$ is less than the negative theoretical duration $T^*_{2,-}$, in particular here $T_{2,-} = T_C/2/2 - f(x_2)$, whereas the positive-activation duration $T_{2,+}$ is equal to the positive theoretical duration $T^*_{2,+}$.

Figures 7, 9:
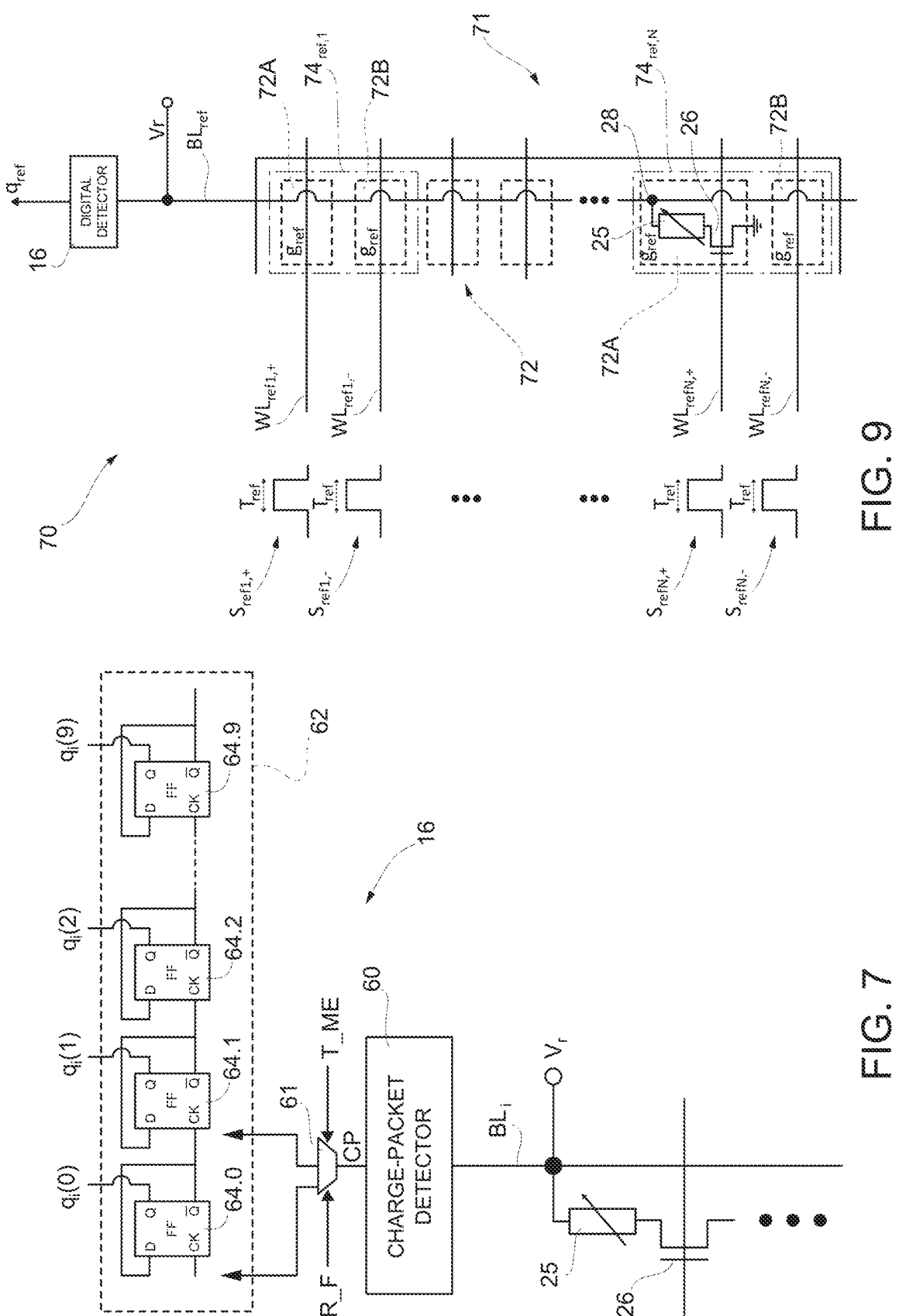
FIG. 7 shows a block diagram of a digital detector of the device of FIG. 1.
FIG. 9 shows a circuit diagram of a reference circuit of the device of FIG. 1.

With reference to FIG. 7, the digital detector 16 associated to the bitline $BL_i$ comprises a charge-packet detector 60 and a charge-packet counter formed by a multiplexer circuit 61 and a counter circuit 62.

The charge-packet detector 60 is coupled to the bitline $BL_i$, performs an integral of the bitline current $I_{BL,i}$ during the effective elaboration interval $T_C$ and, in response, provides a packet-detection signal CP when the charge that has flowed in the bitline $BL_i$ during the effective elaboration interval $T_C$ exceeds a threshold charge $Q_{th}$.

In practice, the packet-detection signal CP indicates the charge measured starting from the bitline current $I_{BL,i}$.

The counter circuit 62 is formed in this embodiment by a succession of flip-flops, here ten flip-flops 64.0, . . . , 64.9, one for each bit of the charge signal $q_i$, cascaded to one another. The multiplexer circuit 61 provides the packet-detection signal CP at input to one of the flip-flops 64.0, . . . , 64.9, as a function of the reduction signal R_F and of the signal T_ME.

The flip-flops 64.0, . . . , 64.9 each have a clock input (CK input), a data input (D input), a Q output and a $\overline{Q}$ output.

The $\overline{Q}$ output of each flip-flop 64.0, . . . , 64.9 is coupled to the respective D input The Q output of each flip-flop 64.0, . . . , 64.9 constitutes a respective bit $q_i(0)$, . . . , $q_i(9)$ of the charge signal $q_i$.

The CK input of the flip-flops 64.1, . . . , 64.9 is coupled to the Q output of the previous flip-flop in the sequence of flip-flops 64.0, . . . , 64.9.

During the first elaboration phase $T_{E1}$ of the effective elaboration interval $T_C$, the multiplexer circuit 61 provides the packet-detection signal CP to the CK input of one of the flip-flops 64.0, . . . , 64.9, according to the reduction factor RF. For instance, in the embodiment illustrated, if RF=2, the multiplexer circuit 61 provides the packet-detection signal CP to the CK input of the second flip-flop 64.1.

During the second elaboration phase $T_{E2}$ of the effective elaboration interval $T_C$, the multiplexer circuit 61 provides the packet-detection signal CP to the CK input of the first flip-flop 64.0.

In other words, during the first elaboration phase $T_{E1}$ of the effective elaboration interval $T_C$, the digital detector 16 multiplies the charge signal $q_i$ by a factor equal to the one used by the input-to-time converters 46 to reduce the duration of the first elaboration phase $T^*_{E1}$ of the theoretical elaboration interval $T^*_C$.

Consequently, the charge signal $q_i$ is indicative of the number of times that the charge that would flow in the bitline $BL_i$ during the theoretical elaboration interval $T^*_C$ would exceed the threshold charge $Q_{th}$, i.e., the number of charge packets that would flow in the bitline $BL_i$ if the activation duration $T_{j,+}$, $T_{j,-}$ of each activation signal $S_{j,+}$, $S_{j,-}$ were equal to the respective theoretical durations $T^*_{j,+}$, $T^*_{j,-}$.

In use, the IMC device 10 may be used for providing the output vector $Y_{MAC}=y_1, \ldots, y_M$ indicative of a MAC operation between the input vector $X=x_1, \ldots, x_N$ and the matrix formed by the computational weights $G_{ij}$.

As discussed with reference to FIG. 2, the positive cell 23A of a generic group of cells $22_{i,j}$ absorbs, during the effective elaboration interval $T_C$, a cell current, here from the respective node 28 to ground 29, which depends upon the transconductance $g_{i,k}$ of the respective storage element 25 and upon the activation duration of the respective selection element 26, i.e., upon the positive-activation duration $T_{j,+}$ of the positive-activation signal $S_{j,+}$.

In detail, during the effective elaboration interval $T_C$, the current that flows through the positive cell 23A has an intensity equal to that of the positive-cell current $I^+_{i,j}$, which depends upon the respective transconductance value $g_{i,k}$, and a time duration that depends upon the positive-activation duration $T_{j,+}$.

The negative cell 23B of the generic group of cells $22_{i,j}$ absorbs, during the effective elaboration interval $T_C$, a cell current, here from the respective node 28 to ground 29, which depends upon the transconductance $g_{i,k+1}$ of the respective storage element 25 and upon the activation duration of the respective selection element 26, i.e., upon the negative-activation duration $T_{j,-}$ of the negative-activation signal $S_{j,-}$.

In detail, during the effective elaboration interval $T_C$, the current that flows through the negative cell 23B has an intensity equal to that of the negative-cell current $I^-_{i,j}$, which depends upon the respective transconductance value $g_{i,k+1}$, and a time duration that depends upon the negative-activation duration $T_{j,-}$.

In this embodiment, the biasing voltage Vr is the same for all the bitlines $BL_1, \ldots, BL_M$; consequently, the current intensities $I^+_{i,j}$ and $I^-_{i,j}$ depend only upon the transconductance of the positive memory cell 23A and the negative memory cell 23B, respectively.

During the effective elaboration interval $T_C$, with reference to the group of cells $22_{i,j}$, the positive cell 23A contributes to a charge displacement $Q^+_{i,j}$ that is a function of the product between the current intensity $I^+_{i,j}$ and the positive-activation duration $T_{j,+}$; the negative cell 23B contributes to a charge displacement $Q^-_{i,j}$ that is a function of the product between the current intensity $I^-_{i,j}$ and the negative-activation duration $T_{j,-}$.

In practice, during the effective elaboration interval $T_C$, each group of cells $22_{i,j}$ contributes to a charge displacement $Q_{i,j}=I^+_{i,j}\cdot T_{j,+}+I^-_{i,j}\cdot T_{j,-}$.

Since the positive-activation duration $T_{j,+}$ and the negative-activation duration $T_{j,-}$ depend upon the respective input value $x_j$, and the current intensities $I^+_{i,j}$, $I^-_{i,j}$ depend upon the computational weight $G_{i,j}$, the charge $Q_{i,j}$ associated to the group of cells $22_{i,j}$ is a function of the product $G_{i,j}\cdot x_j$.

Purely by way of example, the table of FIG. 8 provides an example in which the theoretical elaboration duration is $T^*_C=128$ ns, the input value $x_j$ may assume a value comprised between −64 and +64, and the current intensities $I^+_{i,j}$, $I^-_{i,j}$ may be 0 μA, 1 μA, or 2 μA.

As may be seen from the table of FIG. 6, if the theoretical durations $T^*_{j,+}=T^*_{j,-}=T^*_{ref}=T^*_C/2$ and/or if $I^+_{i,j}=I^-_{i,j}=I_{ref}=I_{tot}/2$, then the group of cells $22_{i,j}$ would contribute to the displacement of a theoretical charge $Q^*_{i,j}$, at the end of the theoretical elaboration interval $T^*_C$, equal to a reference value $Q_{ref}$ that, in the example illustrated, is equal to 128.

In practice, the group of cells $22_{i,j}$ would contribute, in the respective bitline $BL_i$, to a charge displacement equal to the reference value $Q_{ref}$ when the respective activation durations $T_{j,+}$, $T_{j,-}$ are equal to the reference duration, here $T^*_C/2$, and/or when the cell currents $I^+_{i,j}$, $I^-_{i,j}$ are equal to the reference current, here $I_{tot}/2$.

In other words, the group of cells $22_{i,j}$ would contribute to a charge displacement equal to $Q_{ref}$ if $x_j=0$ and/or if $G_{i,j}=0$.

In the cases where $x_j>0$ and $G_{i,j}>0$, or $x_j<0$ and $G_{i,j}<0$, then $Q^*_{i,j}>Q_{ref}$.

In the cases where $x_j>0$ and $G_{i,j}<0$, or $x_j<0$ and $G_{i,j}>0$, then $Q^*_{i,j}<Q_{ref}$.

In practice, by comparing the charge $Q^*_{i,j}$ with the reference charge $Q_{ref}$, it is possible to determine the sign of the operation $G_{i,j}\cdot x_j$.

Furthermore, the absolute value of the difference between the charge $Q^*_{i,j}$ and the reference charge $Q_{ref}$ is indicative of the absolute value of the operation $G_{i,j}\cdot x_j$.

In fact, by considering for example the first row of the table wherein $G_{i,j}=1$, as the absolute value of $x_j$ increases the charge $Q^*_{i,j}$ assumes higher values.

In detail, the absolute value of the difference $|Q^*_{i,j}-Q_{ref}|$ increases, in particular here in a directly proportional way, as the absolute value $|x_j|$ increases.

Furthermore, the same value of charge $Q^*_{i,j}$ is associated to different combinations of $G_{i,j}$ and $x_j$ corresponding to a same result of the operation $G_{i,j}\cdot x_j$ (for example, $G_{i,j}=−1$ and $x_j=−32$, or $G_{i,j}=+1$ and $x_j=+32$).

For each bitline $BL_i$, the respective bitline current $I_{BL,i}$ is given by the sum of the currents of all the cells 20 coupled to the bitline $BL_i$. Consequently, at the end of the effective elaboration interval $T_C$, the total charge $Q_{tot,i}$ that has flowed in the bitline $BL_i$ is equal to the sum of the charge contributions $Q_{i,1}, \ldots, Q_{i,N}$ of all the groups of cells $22_{i,1}, \ldots, 22_{i,N}$ coupled to the bitline $BL_i$; i.e., $$Q_{tot,i} = \sum_{j=1}^{N} Q_{i,j}.$$

In practice, the total charge $Q_{tot,i}$ is indicative of the operation $G_{i1}\cdot x_1+G_{i2}\cdot x_2+ \ldots +G_{iN}\cdot x_N$.

Consequently, associated to the bitline $BL_i$ is a total reference charge $Q_{tot,i}$,ref that is equal to the sum of the reference values $Q_{ref}$ associated to the individual groups of cells 22. In other words, $Q_{tot,i,ref}=N\cdot Q_{ref}$, wherein N is the number of groups of cells 22 coupled to the bitline $BL_i$.

As discussed with reference to FIGS. 3-5, for each input value $x_j$, the respective positive-activation duration $T_{j,+}$, or the respective negative-activation duration $T_{j,-}$ depending on the sign of $x_j$, is less than the respective theoretical duration, since the duration of the first elaboration phase $T^*_{E1}$ (equal to the reference duration $T^*_C/2$) is reduced by the factor RF. For instance, if $x_j>0$, then $T_{j,+}=T^*_C/2/RF+f$ $(x_j)$. Consequently, the effective charge $Q_{i,j}$ displaced by the group 22$_{i,j}$ of memory cells during the first elaboration phase $T_{E1}$ of the effective elaboration interval $T_C$ is less than the theoretical charge $Q^*_{i,j}$ that the group 22$_{i,j}$ of memory cells would have displaced if the positive-activation signal $S_{j,+}$ had had an activation duration $T_{j,+}$ equal to the theoretical duration $T^*_{j,+}$.

However, during the first elaboration phase $T_{E1}$, the digital detector 16 multiplies the detected charge by the factor RF. This enables compensation of the shorter duration of the first elaboration phase $T_{E1}$ as compared to the theoretical duration $T^*_{E1}$. Consequently, the charge signal $q_i$ provided by the digital detector 16 is indicative of the charge that would have flowed in the bitline $BL_i$ if the positive-activation signals $S_{1,+}, \ldots, S_{N,+}$ each had had an activation duration $T_{j,+}$ equal to the theoretical duration $T^*_{j,+}$.

The DSP 17 compares the charge signal $q_i$ with the reference-charge signal $q_{ref}$, which is indicative of the total reference charge $Q_{tot,i,ref}$.

The DSP 17, in response to the comparison between $q_i$ and $q_{ref}$, may determine the sign and absolute value of the result of the MAC operation $G_{i1} \cdot x_1 + G_{i2} \cdot x_2 + \ldots + G_{iN} \cdot x_N$ and provide at output a corresponding output signal $y_i$ indicative of said result.

In detail, the DSP 17 may determine the sign and absolute value of the output signal $y_i$ as a function of the difference between $q_i$ and $q_{ref}$.

The sign of the output signal $y_i$ depends upon the sign of the difference $q_i-q_{ref}$. Starting from what has been discussed previously, in this embodiment, it follows that:

if $q_i=q_{ref}$, then $y_i=0$;

if $q_i>q_{ref}$, then $y_i>0$; and if $q_i<q_{ref}$, then $y_i<0$.

The absolute value of the output signal $y_i$ depends upon the absolute value of the difference $q_i-q_{ref}$, on the basis of the specific conversion function used for mapping the input values $x_1, \ldots, x_N$ into the respective activation durations $T_{1,+}, \ldots, T_{N,+}$ and $T_{1,-}, \ldots, T_{N,-}$ and for mapping the computational weights $G_{i1}, \ldots, G_{iN}$ into the respective current values $I^+_{i,1}, \ldots, I^+_{i,N}$ and $I^-_{i,1}, \ldots, I^-_{i,N}$.

For instance, the DSP 17 may convert the absolute value of the difference $q_i-q_{ref}$ into a specific value of the output signal $y_i$ using a specific conversion table previously stored in the IMC device 10.

In practice, the IMC device 10 allows to obtain a result indicative of the MAC operation $G_{i1} \cdot x_1 + G_{i2} \cdot x_2 + \ldots + G_{iN} \cdot x_N$ using an effective elaboration interval $T_C$ having a duration shorter than the theoretical interval $T^*_C$. Consequently, the IMC device allows to obtain a high number of operations per second, higher than that of an IMC device in which the theoretical elaboration interval $T^*_C$ is used.

For instance, considering an example in which the theoretical elaboration interval has a duration $T^*_C=128$ ns, wherein $T^*_{E1}=T^*_{E2}=64$ ns, and wherein the reduction factor RF=4, it is obtained that the effective elaboration interval has a duration $T_C=80$ ns, wherein $T_{E1}=T^*_{E1}/4=16$ ns and $T_{E2}=T^*_{E2}=64$ ns. Consequently, the effective elaboration interval is shorter by approximately 37% than the theoretical elaboration interval. Thus, the IMC device 10 may perform a number of operations per second higher by 60% than in the case where the effective elaboration interval is equal to the theoretical one.

The fact that, for each group 22$_{i,j}$ of memory cells, the total current $I_{tot}$ may be a linear combination, in particular the sum of the positive-cell current $I^+_{i,j}$ and of the negative-cell current $I^-_{i,j}$, and that the difference between the positive-cell current $I^+_{i,j}$ and the negative-cell current $I^-_{i,j}$ may be a function of the sign and of the absolute value of the computational weight $G_{ij}$, enables each group 22$_{i,j}$ of memory cells to map both the sign and the absolute value of the respective stored computational weight $G_{ij}$.

In addition, the fact that, for each input value $x_j$, the respective positive-activation duration $T_{j,+}$ and negative-activation duration $T_{j,-}$ are determined starting from the positive theoretical duration $T^*_{j,+}$ and the negative theoretical duration $T^*_{j,-}$, respectively, enables mapping both of the sign and of the absolute value of the respective input value $x_j$.

In practice, the IMC device 10 allows to obtain a result, indicative of the sign and absolute value, of the MAC operation $$\sum_{j=1}^{N} G_{i,j} \cdot x_j$$

within a single effective elaboration interval $T_C$ in which both the positive wordlines $WL_{1,+}, \ldots, WL_{N,+}$ and the negative wordlines $WL_{1,-}, \ldots, WL_{N,-}$ are activated.

In other words, the output signal $y_i$ indicative of the sign and absolute value of the operation $$\sum_{j=1}^{N} G_{i,j} \cdot x_j$$

may be obtained in a single MAC elaboration operation of the IMC device 10, i.e., with just one sweep of the timing signal TM between the start value (at the instant $t_{start}$) and the end value (at the instant $t_{end}$).

Consequently, the number of signed MAC operations $$\sum_{j=1}^{N} G_{i,j} \cdot x_j$$

that the IMC device 10 is able to execute per second (Tera Operations Per Second, TOPS) may be doubled as compared to a solution in which the positive elaboration and the negative elaboration are carried out in two effective elaboration intervals $T_C$ distinct from one another.

Figure 5:
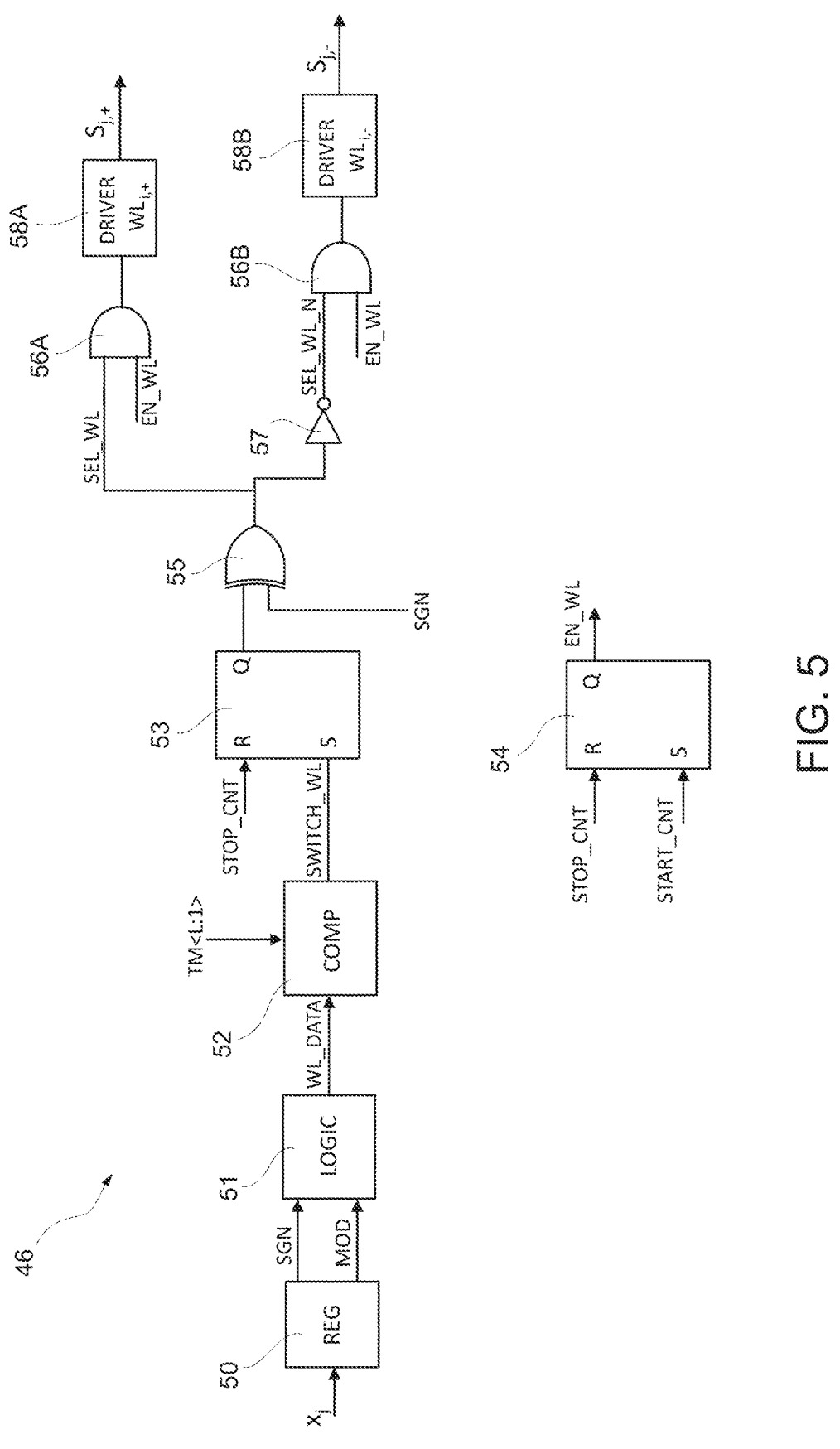
FIG. 5 shows a detailed circuit diagram of a portion of the circuit of FIG. 3.

In particular, the embodiment of the input-to-time converter 46 of FIG. 5 allows to distribute the current of each bitline $BL_i$ into two subintervals ($T_{j,+}$ and $T_{j,-}$) of the effective elaboration interval $T_C$ distinct from one another. This enables simplification of the design of the digital converters 16 and increase of accuracy thereof.

According to one embodiment, the IMC device 10 may comprise a reference circuit 70 (FIG. 9) configured to generate the reference-charge signal $q_{ref}$ used by the DSP 17 for determining the sign and absolute value of the output signals $y_i$.

The reference circuit 70 comprises a reference array 71 formed by one or more reference memory cells 72 and at least one digital converter, also here designated by 16.

The memory cells 72 may be equal to the memory cells 20 described with reference to FIG. 1; i.e., formed by a storage element 25 and a selection element 26.

In the embodiment illustrated, the reference array 71 is formed by a reference bitline $BL_{ref}$ to which K memory cells 72 are coupled.

The memory cells 72 are organized so as to form N groups 74 of reference memory cells, as discussed for the groups 22 of memory cells of FIG. 1.

The groups 74 of reference memory cells are each designated also by reference $74_{ref,j}$, where j=1, . . . , N.

Each group $74_{ref,j}$ of reference memory cells is formed by a positive cell 72A and a negative cell 72B coupled to a positive wordline $WL_{ref,j,+}$ and a negative wordline $WL_{ref,j,-}$, respectively, as discussed for the groups 22 of memory cells of FIG. 1.

The wordlines $WL_{ref,j,+}$, $WL_{ref,j,-}$ receive, in use, a respective reference activation signal $S_{ref,j,+}$, $S_{ref,j,-}$, which may be generated by a reference input-to-time converter 77 equal to the input-to-time converters 46 of FIG. 4.

The reference circuit 70 is configured to cause, in use, during the effective elaboration interval $T_C$, a charge displacement in the reference bitline $BL_{ref}$ that is indicative of a MAC elaboration operation of a bitline $BL_i$ having zero as result ($y_i=0$), for example an elaboration operation in which all the input values $x_1$, . . . , $x_N$ are equal to zero and/or in which all the computational weights $G_{i,1}$, . . . , $G_{i,N}$ are equal to zero.

In this embodiment, all the positive-reference activation signals $S_{ref,j,+}$ have an activation duration equal to the duration $T_{E1}$ of the first elaboration phase $T_{E1}$, and all the negative-reference activation signals $S_{ref,j,-}$ have an activation duration equal to the duration $T_{E2}$ of the second elaboration phase $T_{E2}$.

However, the duration of the signals $S_{ref,j,+}$, $S_{ref,j,-}$ may be equal to $T_{E2}$ and $T_{E1}$, respectively.

Furthermore, all the reference groups 74 are programmed so that the respective stored computational weights $G_{i1}$, . . . , $G_{iN}$ correspond to the zero computational weight, i.e., so that the current intensity that flows in use in the respective memory cells is $I^+_{ref,j}=I^-_{ref,j}=I_{ref}$ However, different combinations of the activation durations of the reference activation signals $S_{ref,j,+}$, $S_{ref,j,-}$ and/or different combinations of the reference currents $I^+_{ref,j}$, $I^-_{ref,j}$ may be chosen, in the initialization stage, so that the charge displaced in the reference bitline $BL_{ref}$ during the effective elaboration interval $T_C$ corresponds to a result of a MAC elaboration operation of the array 12 equal to 0.

FIG. 10 shows, purely by way of example, the plot of the timing signal TM, of the reference-charge signal $q_{ref}$ generated by the reference circuit 70, and of two generic charge signals $q_{i1}$, $q_{i2}$ illustrated in FIG. 1, within the effective elaboration interval $T_C$.

In detail, the charge signal $q_{i1}$ is the signal provided by the digital detector 16 coupled to the bitline $BL_{i1}$, and the charge signal $q_{i2}$ is the signal provided by the digital detector 16 coupled to the bitline $BL_{i2}$.

In FIG. 10, of the signals TM, $q_{ref}$, $q_{i1}$, and $q_{i2}$ there are shown, for simplicity, the corresponding analog trends so as to highlight a possible evolution thereof within the elaboration interval $T_C$.

In addition, purely by way of example, the signals $q_{i1}$, $q_{i2}$, $q_{ref}$ in FIG. 10 have a ramp-like trend having a constant slope in the effective elaboration interval $T_C$. However, the effective trend depends upon the specific input values and computational weights.

In the example illustrated, the charge signal $q_{i2}$ is greater than the reference-charge signal $q_{ref}$. Consequently, the DSP 17 provides, starting from the charge signal $q_{i2}$, the corresponding output signal $y_{i2}$ indicating a value greater than zero.

The charge signal $q_{i1}$ is lower than the reference-charge signal $q_{ref}$. Consequently, the corresponding output signal $y_{i1}$ provided by the DSP 17 indicates a value of less than zero.

Furthermore, the absolute value of the difference $\Delta q_{i1}$ between $q_i$ and $q_{ref}$ is less than the absolute value of the difference $\Delta q_{i2}$ between $q_{i2}$ and $q_{ref}$. Consequently, the output signal $y_{i1}$ is indicative of an absolute value lower than the one indicated by the output signal $y_{i2}$. In other words, the MAC operation $$\sum_{j=1}^{N} G_{i1,j} \cdot x_j$$

associated to the column i1 has an absolute value lower than the MAC operation $$\sum_{j=1}^{N} G_{i2,j} \cdot x_j$$

associated to the column i2.

The fact that the reference-charge signal $q_{ref}$ is generated by the reference circuit 70 using the reference memory cells 72 allows to follow any possible modification of the reference charge value $Q_{ref}$, for example due to drifts in time of the values of transconductance of the storage elements 25.

Consequently, the IMC device 10 may provide at output an accurate result even in the presence of deviations of the memory array 12 with respect to the behavior established in the initialization stage.

Furthermore, the possibility of regulating the charge value indicated by the reference-charge signal $q_{ref}$ may be useful in the case where mapping of the computational weights $G_{ij}$ into the respective current values $I^+_{i,j}$ and $I^-_{i,j}$ and/or mapping of the input values $x_j$ into the respective theoretical durations $T^*_{j,+}$ and $T^*_{j,-}$ are not symmetrical with respect to zero.

Figure 11:
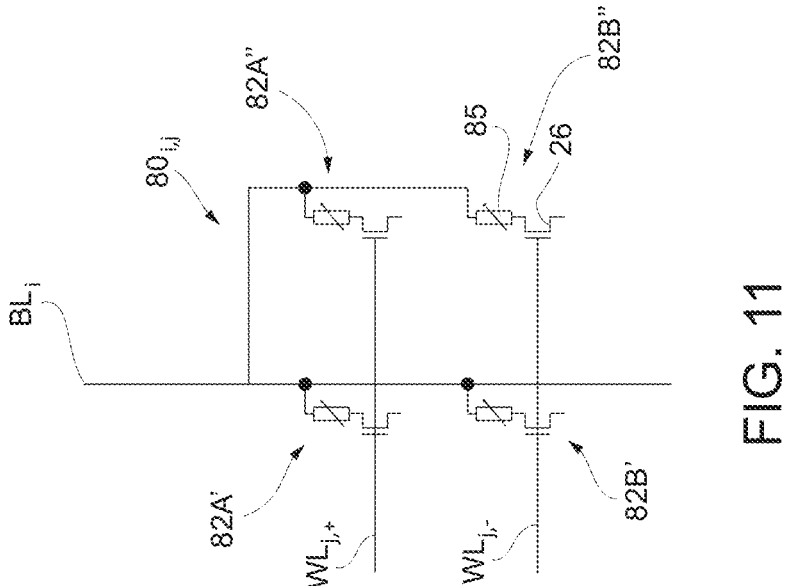
FIG. 11 shows a detailed circuit diagram of a group of memory cells of the device of FIG. 1.

FIG. 11 shows a different embodiment of a generic group of cells, here designated by reference $80_{i,j}$, of the memory array 12 of FIG. 1.

The group $80_{i,j}$ of memory cells is formed by four cells, including two positive cells 82A', 82A" and two negative cells 82B', 82B". In practice, the positive cells 82A', 82A" form a positive subset of cells, and the negative cells 82B', 82B" form a negative subset of cells.

The cells 82A', 82A", 82B', 82B" are equal to the cells 20 of FIG. 1 and each comprise a respective storage element, here designated by 85, and a selection element 26.

The common node 28 of each of the cells 82A', 82A", 82B', 82B" is coupled, here directly connected, to the bitline $BL_i$.

The selection elements 26 of the positive cells 82A', 82A" are coupled to the positive wordline $WL_{j,+}$. The selection elements 26 of the negative cells 82B', 82B" are coupled to the negative wordline $WL_{j,-}$.

The storage elements 85 are each variable resistive elements, in particular also here based upon a phase-change material (PCM).

In this embodiment, each of the storage elements 85 may be programmed for representing two distinct logic states, for example '0' and '1'; i.e., they may be programmed to have two distinct transconductance values $g_1$, $g_2$, where $g_1 < g_2$, to which there correspond two respective current values $I_1$ and $I_2$.

For instance, for Vr=100 mV, each cell 82A', 82A", 82B', 82B" may be flown through by a current $I_1=0$ μA if the respective transconductance is equal to $g_1$, or $I_2=1$ μA if the respective transconductance is equal to $g_2$.

The positive cells 82A', 82A" are arranged in parallel to one another from an electrical standpoint and are coupled to the positive wordline $WL_{j,+}$; consequently, the positive cells 82A', 82A" operate as a single positive cell that may be programmed for absorbing, from the bitline $BL_i$, a positive-cell current $I^+_{i,j}$ having one of the following three values: $I_1+I_1$, $I_1+I_2$, or $I_2+I_2$.

Likewise, the negative cells 82B', 82B" are arranged in parallel to one another from an electrical standpoint and are coupled to a same negative wordline $WL_{j,-}$; consequently, the negative cells 82B', 82B" operate as a single negative cell that may be programmed for absorbing, from the bitline $BL_i$, a current $I^-_{i,j}$ having one of the following three values: $I_1+I_1$, $I_1+I_2$, or $I_2+I_2$.

Thus, the group 80$_{i,j}$ of cells has, from an electrical standpoint, an overall behavior that is the same as the one described for the group 22$_{i,j}$ of memory cells of FIG. 1.

Consequently, the group 80$_{i,j}$ of cells may be used for representing a respective computational weight $G_{i,j}$ having sign and absolute value, in the same manner as discussed for the group 22$_{i,j}$ of cells of FIG. 1.

Figure 12:
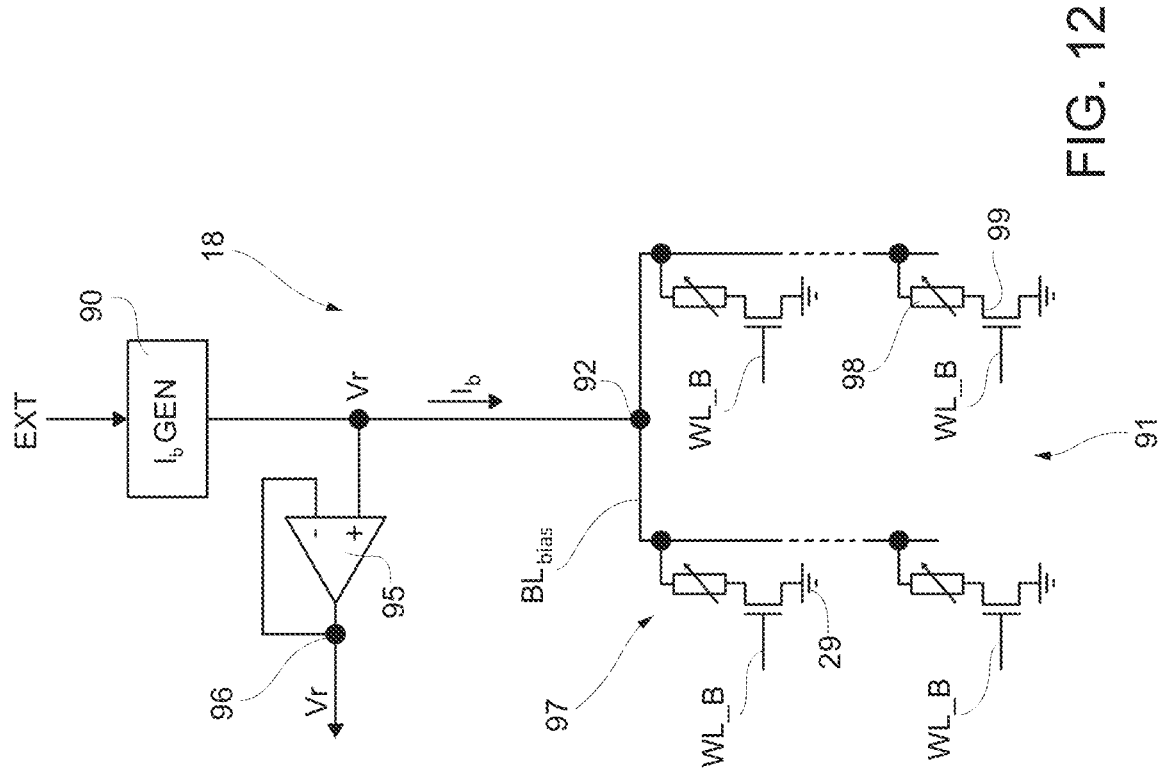
FIG. 12 shows a circuit diagram of a biasing circuit of the device of FIG. 1.

FIG. 12 shows an embodiment of the biasing circuit 18 of the IMC device 10.

The biasing circuit 18 generates the biasing voltage Vr starting from a biasing current $I_b$ and provides the biasing voltage Vr to the bitlines $BL_1, \ldots, BL_M$ of the memory array 12 of FIG. 1.

In this embodiment, the biasing circuit 18 provides the same voltage Vr to all the bitlines $BL_1, \ldots, BL_M$. However, the biasing circuit 18 may provide to the bitlines $BL_1, \ldots, BL_M$, starting from the biasing voltage Vr, biasing voltages different from one another, according to the specific application.

The biasing circuit 18 comprises a current source 90 generating the biasing current $I_b$ and a reference network 91 having an input node 92 and a biasing impedance $Z_b$.

In this embodiment, the current source 90 is a controllable current source that receives an external signal EXT, for example from a user of the IMC device 10, which is indicative of a desired value of the biasing current $I_b$.

The biasing network 91 receives the biasing current $I_b$ at the input node 92. The input node 92 is at a voltage that is a function of the biasing current $I_b$ and of the biasing impedance $Z_b$.

The biasing circuit 18 further comprises a voltage-distribution circuit, here formed by an operational amplifier 95 having an output 96 that provides the biasing voltage Vr.

The operational amplifier 95 has a non-inverting input coupled to the input node 92 of the biasing network 91. The operational amplifier 95 has an inverting input coupled, in particular here directly coupled, to the output 96 of the operational amplifier 95.

The output 96 of the amplifier 95 is coupled to the bitlines $BL_1, \ldots, BL_M$, for example directly or via a dedicated circuit, according to the specific application.

In practice, in this embodiment, the voltage at the input node 92 of the biasing network 91 constitutes the biasing voltage Vr.

In detail, in this embodiment, the biasing network 91 is formed by a biasing memory array, which is consequently also designated hereinafter by 91, having an overall biasing transconductance value $g_b$ and comprising one or more memory cells, here a plurality of memory cells 97, of a nonvolatile type.

The biasing array 91 may be a portion of the memory array 12 or may be a separate memory array.

The cells 97 of the biasing array 91 have the same circuit configuration as that of the memory cells 20 of the memory array 12 of FIG. 1.

In detail, the cells 97 of the biasing array 91 each comprise a storage element 98 and a selection element 99, in particular equal to the storage element 25 and the selection element 26, respectively, of the memory cells 20.

In practice, the storage element 98 is based upon the same technology as that used to obtain the storage element 25. For instance, if the storage element 25 is based upon a PCM material, then also the storage element 98 is based upon a PCM material, in particular the same PCM material.

The cells 97 of the biasing array 91 are programmed for storing respective transconductance values that may be equal to or different from one another, according to the specific application.

The number of cells 97 of the biasing array 91 and the respective transconductance values may be chosen, in the design stage, so that the biasing array 91 constitutes a statistically significant sample of the memory array 12.

In practice, the overall biasing transconductance value $g_b$ of the biasing array 91 represents, from a statistical standpoint, an overall transconductance of the memory array 12.

For instance, the overall transconductance of the memory array 12 may be equal to the transconductance that the memory array 12 would have if all the memory cells 20 were activated simultaneously during the effective elaboration interval $T_C$.

For instance, the number of memory cells 97 may be higher than one hundred.

For instance, the memory cells 97 may be programmed so that the overall biasing transconductance $g_b$ of the biasing array 91 is equal to a mean value of the overall transconductance of the memory array 12.

For instance, the mean value may represent the mean transconductance value that the memory array 12 has during use, for example as measured during a calibration or initialization stage of the IMC device 10.

The storage elements 98 have a first terminal that is coupled to the input node 92 of the biasing network 91 and a second terminal coupled to a reference-potential node, here to ground 29, via the selection element 99.

In practice, the memory cells 97 all share a same biasing bitline $BL_{bias}$.

The selection elements 99 are each formed by a respective switch, for example a BJT, a diode, or a MOSFET, here an NMOS transistor, which in particular is equal to the selection element 26 of the memory cells 20 and is arranged in series to the respective storage element 98.

In this embodiment, the selection elements 99 of all the cells 97 are coupled to a same wordline WL_B so as to be controlled by a same biasing activation signal, which, for example, may be generated by the wordline-activation unit 14 or by other components of the IMC device 10, here not illustrated.

However, the selection elements 99 may each be controlled by a respective activation signal, differing from one another, for example according to which memory cells are to be activated during a computation by the IMC device 10.

The biasing impedance $Z_b$ is a function of the transconductance values stored by the memory cells 97 and of the duration of the biasing activation signal provided to the biasing wordlines WL_B.

The fact that the biasing voltage Vr is generated starting from the biasing current $I_b$ enables regulation of the biasing voltage Vr by varying the biasing impedance $Z_b$ and/or the biasing current $I_b$.

During the life of the IMC device 10, the IMC device 10 may be subject to temperature variations that may affect the values of transconductance of the memory cells 20. In addition, the values of transconductance of the memory cells 20 may be subject to drift; for example, in the case where the memory cells 20 are PCM memory cells, the storage elements 25 may be subject to phenomena of ageing such as amorphization.

Such deviations of the transconductance values from the programmed values may cause a variation of the positive current $I^+_{i,j}$ and of the negative current $I^-_{i,j}$ with respect to the programmed value, thus causing errors in mapping of the computational weight $G_{ij}$ and thus in the output signal $y_i$.

However, the temperature variations or drifts that may affect the memory cells 20, also affect the values of transconductance of the memory cells 97 of the biasing array 91, since the memory cells 97 represent a statistically significant sample of the memory cells 20.

Consequently, also the overall value of transconductance $g_b$ of the biasing array 91 would be affected by such deviations or drifts.

The variation of the overall transconductance value $g_b$ implies a variation of the biasing impedance $Z_b$ and, consequently, a variation of the voltage at the input node 92 of the reference network 91. Consequently, also the biasing voltage Vr may vary as a function of the temperature and of phenomena of drift of the memory cells 20.

In detail, the variation of the biasing voltage Vr is such as to compensate the variation of the values of transconductance of the memory cells 20.

For instance, if the memory cells 20 undergo a drift that causes an increase in the respective transconductance values, also the currents $I^+_{i,j}$, $I^-_{i,j}$ increase. Consequently, also the corresponding bitline current $I_{BL,i}$ increases. However, at the same time, also the overall value of biasing transconductance $g_b$ of the biasing array 91 increases.

An increase in the transconductance $g_b$ implies a decrease in the biasing impedance $Z_b$ and, consequently, a decrease in the biasing voltage Vr.

A decrease in the biasing voltage Vr involves a decrease in the currents $I^+_{i,j}$, $I^-_{i,j}$ and thus in the corresponding bitline current $I_{BL,i}$.

In other words, the biasing circuit 18 of FIG. 10 enables compensation of possible variations of the currents $I^+_{i,j}$, $I^-_{i,j}$ that would originate from the drift of the values of transconductance of the memory cells 20. In this way, throughout the life of the IMC device 10, it is possible to keep the currents $I^+_{i,j}$, $I^-_{i,j}$ equal to the respective design values, thus preventing possible errors of the IMC device 10 during execution of the MAC operations.

Figure 13:
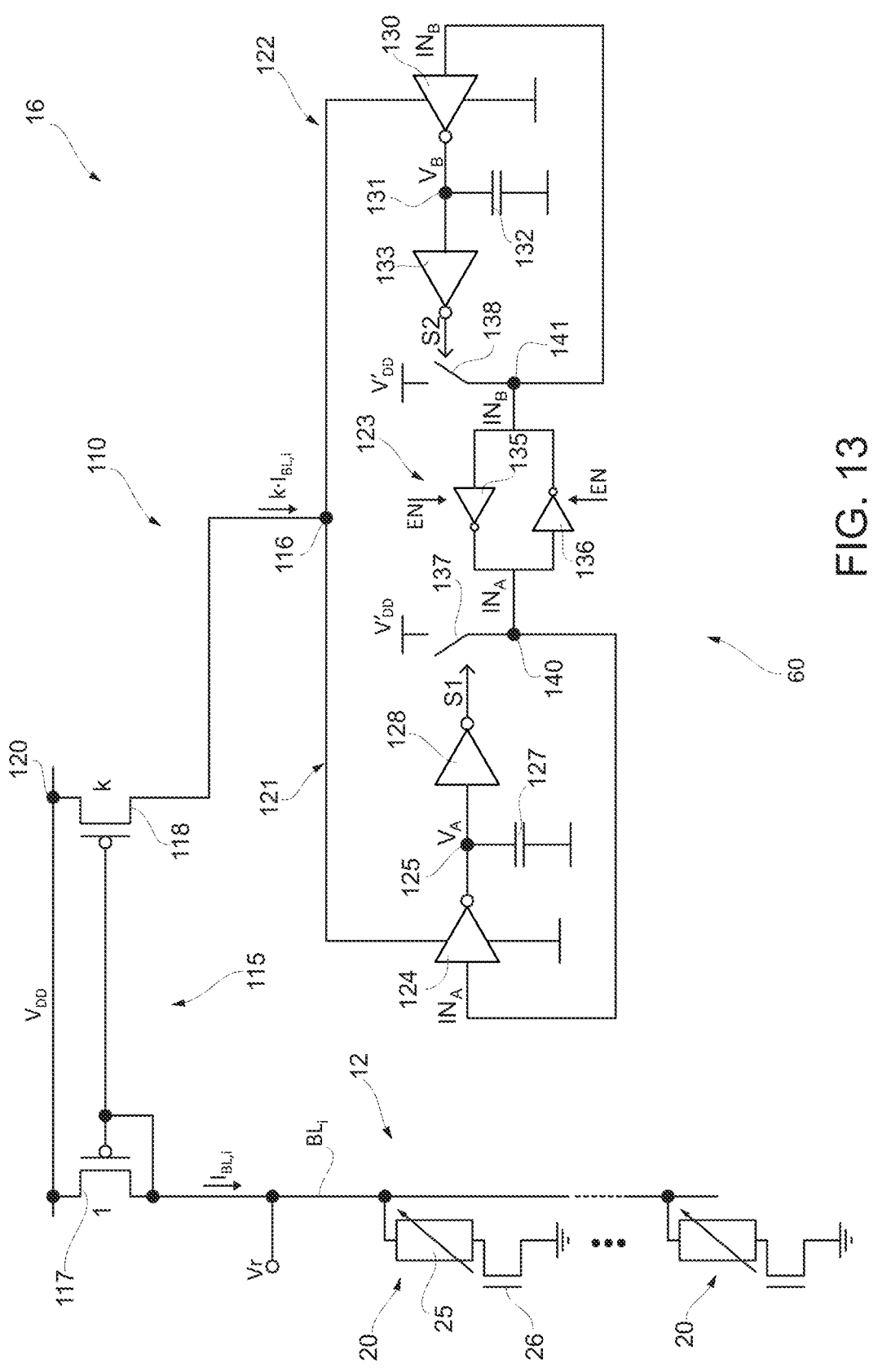
FIGS. 13 and 14 show a detailed circuit diagram of the digital detector of FIG. 7.

FIG. 13 shows in detail an embodiment of the digital detectors 16 of FIG. 7, in particular of the respective charge-packet detector 60, also referred to hereinafter as "integration stage".

The digital detectors 16 are described hereinafter with reference to the digital detector 16 coupled to any bitline $BL_i$ of the plurality of bitlines $BL_1, \ldots, BL_M$.

In this embodiment, the integration stage 60 comprises a current mirror 115 that mirrors the bitline current $I_{BL,i}$ of the bitline $BL_i$ in an input node 116 of the respective integration stage 111.

The current mirror 115 has a current ratio 1:k, so that a mirrored bitline current $k \cdot I_{BL,i}$ flows through the input node 116 of the integration stage 60.

In detail, the current mirror 115 has a first branch, here formed by a respective PMOS transistor 117, coupled to the bitline $BL_i$, and a second branch, here formed by a respective PMOS transistor 118, coupled to the respective integration stage 60.

The sources of the PMOS transistors 117, 118 are coupled to a supply node 120, here at a voltage $V_{DD}$, and the gates of the PMOS transistors 117, 118 are coupled to one another and to the drain of the PMOS transistor 117. The drain of the PMOS transistor 118 is coupled, in particular here directly connected, to the input node 116 of the integration stage 60.

The integration stage 60 comprises a first integration circuit 121, a second integration circuit 122, and a switching circuit 123 coupled between the first and the second integration circuits 121, 122.

The first and the second integration circuits 121, 122 are coupled to the input node 116 so as to receive the mirrored bitline current $k \cdot I_{BL,i}$.

The first integration circuit 121 comprises a first inverter 124 having an output 125, a capacitor 127 with capacitance $C_A$ coupled to the output 125 of the first inverter 124, and a second inverter 128, the input of which is coupled to the output 125 of the first inverter 124.

The first inverter 124 has a supply node coupled to the input node 116 of the integration stage 60 (FIG. 14) and receives at input a first control signal $IN_A$.

In practice, the first inverter 124 is biased by the mirrored bitline current $k \cdot I_{BL,i}$.

The capacitor 127 has a first terminal coupled to the output node 125 of the first inverter 124 and a second terminal coupled to a reference node, here ground.

The output node 125 of the first inverter 124 is at a first integration voltage $V_A$ dropping across the capacitor 127.

The second inverter 128 has a first sampling threshold, in what follows defined as first threshold $V_{th1}$, receives at input the first integration voltage $V_A$, and provides at output a first switch signal S1 as a function of the first threshold $V_{th1}$ and of the first integration voltage $V_A$.

In detail, the first switch signal S1 is a logic signal having high logic value when the first integration voltage $V_A$ is lower than the first threshold $V_{th1}$, and a low logic value when the first integration voltage $V_A$ is higher than the first threshold $V_{th1}$.

The second integration circuit 122 comprises a first inverter 130 having an output 131, a capacitor 132 with capacitance $C_B$ coupled to the output 131 of the first inverter 130, and a second inverter 133, the input of which is coupled to the output 131 of the first inverter 130.

The first inverter 130 has a supply node coupled to the input node 116 of the integration stage 60 and receives at input a second control signal $IN_B$.

In practice, the first inverter 130 is biased by the mirrored bitline current $k \cdot I_{BL,i}$.

The capacitor 132 has a first terminal coupled to the output node 131 of the first inverter 130 and a second terminal coupled to a reference node, here ground.

The output node 131 of the first inverter 130 is at a second integration voltage $V_B$ dropping across the capacitor 131.

The second inverter 133 has a second sampling threshold $V_{th2}$, in what follows defined as second threshold $V_{th2}$, receives at input the second integration voltage $V_B$, and provides at output a second switch signal S2 as a function of the second threshold $V_{th2}$ and of the second integration voltage $V_B$.

In detail, the second switch signal S2 is a logic signal having a high logic value when the second integration voltage $V_B$ is lower than the second threshold $V_{th2}$, and a low logic value when the second integration voltage $V_B$ is higher than the second threshold $V_{th2}$.

In this embodiment, the first threshold $V_{th1}$ is equal to the second threshold $V_{th2}$; however, the first threshold $V_{th1}$ may be different from the second threshold $V_{th2}$, according to the specific application.

The switching circuit 123 is a latch formed by two inverters 135, 136 arranged in a ring configuration, a first switch 137 controlled by the first switch signal S1, and a second switch 138 controlled by the second switch signal S2.

The switching circuit 123 has a first node 140 coupled to the input of the inverter 136 and to the output of the inverter 135 and a second node 141 coupled to the output of the inverter 136 and to the input of the inverter 135.

The first node 140 provides the first control signal $IN_A$. The second node 141 provides the second control signal $IN_B$.

The first switch 137 is coupled between the first node 140 and a node at a voltage $V'_{DD}$, and the second switch 138 is coupled between the second node 141 and the node at the voltage $V'_{DD}$.

The voltage $V'_{DD}$ may be equal to or different from the voltage $V_{DD}$ of the supply node 120. For instance, if the voltage $V'_{DD}$ is different from, in particular less than, the voltage $V_{DD}$, the digital detector 16 may comprise a voltage-scaling circuit, for example a transistor, here not illustrated, whose source and drain terminals are coupled between the supply node 120 and the input node 116 of the integration stage 60.

In this embodiment, the switching circuit 123 also receives an enable signal EN, which controls activation of the switching circuit 123. For instance, the enable signal EN may be used for keeping the switching circuit 123 turned off when it is not in use, thus enabling optimization of energy consumption. In addition, the enable signal EN may be used for setting the switching circuit 123 in a defined state, for example upon switching-on of the IMC device 10.

The first and the second control signals $IN_A$, $IN_B$ may constitute the packet-detection signal CP (FIG. 7) and thus be provided at input to the multiplexer circuit 61, as described in detail with reference to FIG. 7. For instance, the signals $IN_A$, $IN_B$ may be used alternatively one after another as packet-detection signals.

Figures 14, 15:
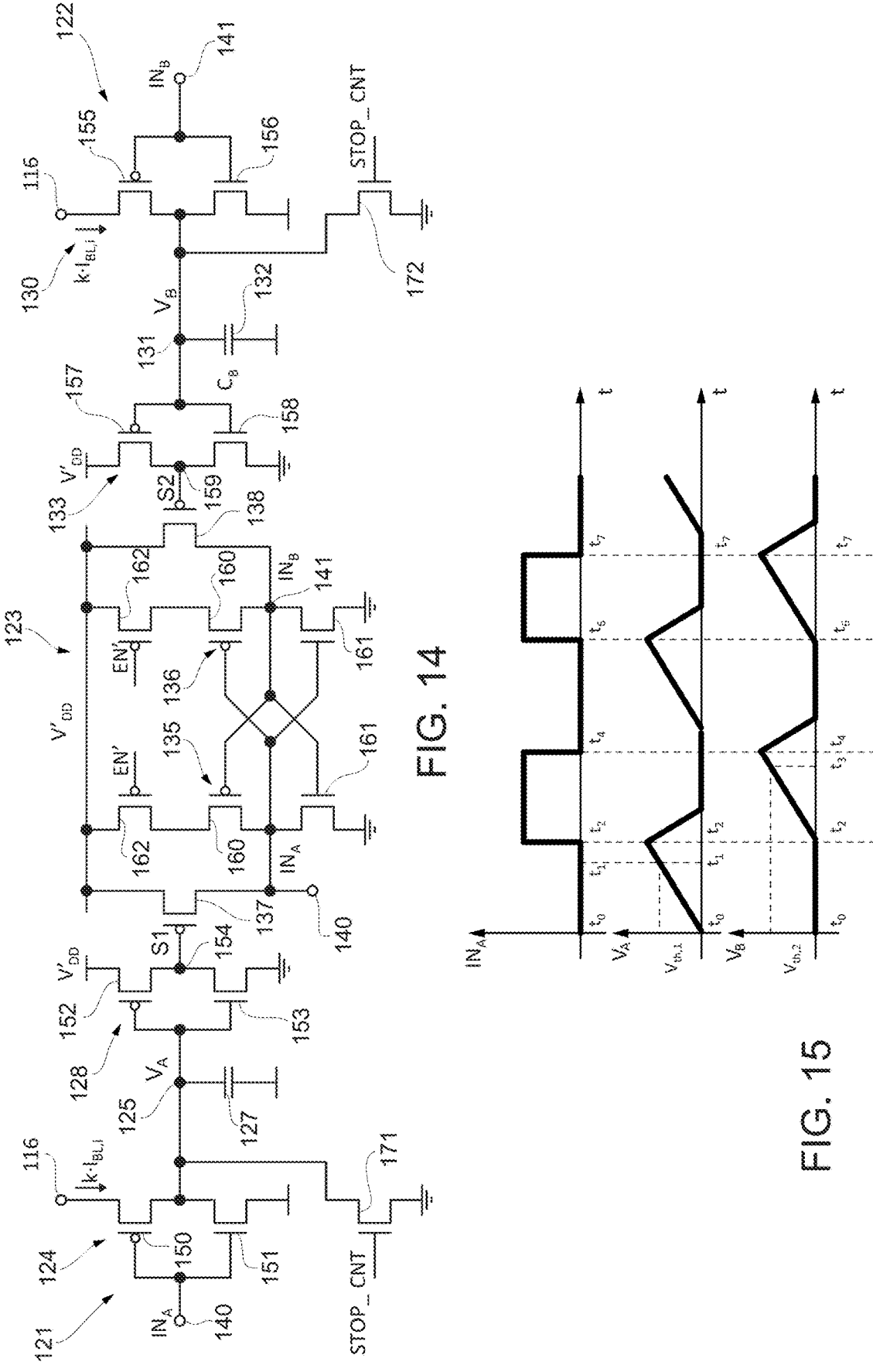
FIG. 15 shows waveforms exemplifying the digital detector of FIG. 13, in use.

With reference to FIG. 14, the first inverter 124 of the first integration circuit 121 is a CMOS inverter formed by the series circuit of a PMOS transistor 150 and an NMOS transistor 151, mutually coupled at the output node 125. The PMOS and NMOS transistors 150, 151 receive the first control signal $IN_A$ at the respective gate terminals.

The source of the PMOS transistor 150 is coupled to the input node 116 of the integration stage 60.

The second inverter 128 of the first integration circuit 121 is a CMOS inverter formed by the series circuit of a PMOS transistor 152 and an NMOS transistor 153, mutually coupled at a node 154 that provides the first switch signal S1.

The first threshold $V_{th1}$ of the second inverter 128 is the switching threshold of the second inverter 128, and consequently depends upon the properties, for example upon the threshold or upon the ON-state resistance, of the PMOS and NMOS transistors 152, 153. In practice, the switching threshold may be the input voltage for which the output of the inverter has a high logic value or else the input voltage for which the output of the inverter has a low logic value.

For instance, the switching threshold of the second inverter 128 may be defined as the operating point at which the respective input voltage, i.e., the first integration voltage $V_A$, is equal to the respective output voltage, i.e., the first switch signal S1.

The first inverter 130 of the second integration circuit 122 is a CMOS inverter formed by the series circuit of a PMOS transistor 155 and an NMOS transistor 156, mutually coupled at the output node 131. The PMOS and NMOS transistors 155, 156 receive the second control signal $IN_B$ at their respective gate terminals.

The source of the PMOS transistor 155 is coupled to the input node 116 of the integration stage 60.

The second inverter 133 of the second integration circuit 122 is a CMOS inverter formed by the series circuit of a PMOS transistor 157 and an NMOS transistor 158, mutually coupled at a node 159 that provides the second switch signal S2.

The second threshold $V_{th2}$ of the second inverter 133 is the switching threshold of the second inverter 133; i.e., it depends upon the properties of the PMOS and NMOS transistors 157, 158. For instance, the switching threshold depends upon the gate-to-source voltage that enables a current to flow through the source-to-drain path of the PMOS and NMOS transistors 157, 158.

As illustrated in the detailed implementation of FIG. 14, the first and second inverters 135, 136 of the switching circuit 123 are cross-coupled CMOS inverters, each comprising a respective PMOS transistor 160 and a respective NMOS transistor 161 mutually coupled in series between a supply node, here at the voltage $V'_{DD}$, and ground.

Furthermore, the first and second inverters 135, 136 of the switching circuit 123 each also comprise a respective enable switch, here a PMOS transistor 162, which is coupled between the supply node at the voltage $V'_{DD}$ and the PMOS transistor 160 of the respective inverter.

The PMOS transistors 162 are controlled by the enable signal EN.

In use, the bitline current $I_{BL,i}$ of the bitline BL is mirrored in the integration stage 60 of the respective digital detector 16.

FIG. 15 shows an example of the trend over time of the first control signal $IN_A$, of the first integration voltage $V_A$, and of the second integration voltage $V_B$ of the digital detector 16 of FIG. 13.

For $t_0 < t < t_1$, the first integration voltage $V_A$ is lower than the first threshold $V_{th,1}$. Consequently, the PMOS transistor 152 of the second inverter 128 is on and the NMOS transistor 153 of the second inverter 128 is off. Consequently, the first switch signal S1 (here not illustrated) has a high value, and the first switch 137 is open. The first control signal $IN_A$ has a low value.

It follows that, with reference to the first inverter 124 of the first integration circuit 121, for $t_0 < t < t_1$, the PMOS transistor 150 is on, and the NMOS transistor 151 is off.

At the same time, for $t_0 < t < t_1$, the second control signal $IN_B$ has the high value. Consequently, with reference to the first inverter 130 of the second integration circuit 122, for $t_0 < t < t_1$, the PMOS transistor 155 is off, and the NMOS transistor 156 is on.

Consequently, the mirrored bitline current $k \cdot I_{BL,i}$ flows, from the input node 116, only through the first inverter 124 of the first integration circuit 121 and not through the first inverter 130 of the second integration circuit 122.

In detail, the mirrored bitline current $k \cdot I_{BL,i}$ traverses the PMOS transistor 150 and charges the capacitor 127. The first integration voltage $V_A$ thus increases in time for $t_0 < t < t_1$.

In detail, in the example of FIG. 15, the first integration voltage $V_A$ increases linearly in time for $t_0 < t < t_1$; however, the evolution of the first integration voltage $V_A$ depends upon the specific evolution of the bitline current $I_{BL,i}$ in the time interval $t_0 < t < t_1$.

When the first integration voltage $V_A$ becomes equal to the first threshold voltage $V_{th,1}$, the NMOS transistor 153 of the second inverter 128 switches on and the PMOS transistor 152 switches off.

In this embodiment, the first control signal $IN_A$ assumes a high value at an instant $t_2$.

The time delay between the instants $t_1$ and $t_2$ may correspond, for example, to the propagation delay of the second inverter 128 of the first integration circuit 121 and/or to the switching time of the first switch 137.

For $t_1 < t < t_2$, the mirrored bitline current $I_{BL,i}$ continues to charge the capacitor 127; consequently, the first integration voltage $V_A$ increases up to a maximum value (instant $t_2$).

At the instant $t_2$, when the first control signal $IN_A$ assumes a high value, the second control signal $IN_B$ (here not illustrated) assumes a low value (the inverter 136 of the switching circuit 123 receives at input the first control signal $IN_A$).

While the first control signal $IN_A$ has a high value, the PMOS transistor 150 and the NMOS transistor 151 of the first inverter 124 of the first integration circuit 121 are, respectively, off and on. At the same time, while the second control signal $IN_B$ has a low value, the PMOS transistor 155 and the NMOS transistor 156 of the first inverter 130 of the second integration circuit 122 are, respectively, on and off.

Consequently, for $t > t_2$, the mirrored bitline current $k \cdot I_{BL,i}$ flows, from the input node 116, only through the first inverter 130 of the second integration circuit 122 and not through the first inverter 124 of the first integration circuit 121.

In detail, the mirrored bitline current $k \cdot I_{BL,i}$ flows through the PMOS transistor 155 and charges the capacitor 132 of the second integration circuit 122. The second integration voltage $V_B$ thus increases in time from the instant $t_2$.

In detail, in the example of FIG. 15, the second integration voltage $V_B$ increases linearly in time for $t > t_2$; however, the evolution of the second integration voltage $V_B$ depends upon the specific evolution of the bitline current $I_{BL,i}$.

While the first control signal $IN_A$ has a high value, the capacitor 127 of the first integration circuit 121 discharges through the NMOS transistor 151 of the first inverter 124. The first integration voltage $V_A$ thus decreases to zero.

When the second integration voltage $V_B$ becomes equal to the second threshold voltage $V_{th,2}$ (instant $t_3$), the NMOS transistor 158 of the second inverter 133 switches on and the PMOS transistor 157 switches off.

Consequently, at an instant $t_4$, the second control signal $IN_B$ assumes a high value, in a way similar to what has been discussed above for the first control signal $IN_A$ at the instant $t_2$.

In detail, in response to reaching of the second threshold $V_{th,2}$ by the second integration voltage $V_B$, the second switch signal S2 switches to the low value and the second switch 138 closes so that the second node 141 is at the voltage $V'_{DD}$ and, consequently, the second control signal $IN_B$ assumes a high value.

The time delay between the instants $t_3$ and $t_4$ may correspond, for example, to the propagation delay of the second inverter 133 of the second integration circuit 122 and/or to the switching time of the second switch 138.

For $t_3 < t < t_4$, the mirrored bitline current $k \cdot I_{BL,i}$ continues to charge the capacitor 132 of the second integration circuit 122; consequently, the second integration voltage $V_B$ increases up to a maximum value (instant $t_4$).

For $t_2 < t < t_4$, the switching circuit 123 keeps the first control signal $IN_A$ at the high value and the second control signal $IN_B$ at the low value.

At the instant $t_4$, the first control signal $IN_A$ again assumes a low value, in response to the fact that the second control signal $IN_B$ assumes the high value.

In response to the fact that the first control signal $IN_A$ assumes the low value, the mirrored bitline current $k \cdot I_{BL,i}$ again charges the capacitor 127 of the first integration circuit 121 up to an instant to, analogously to what has been discussed for $t_1 < t < t_2$.

Consequently, from the instant $t_6$ to the instant $t_7$, the mirrored bitline current $k \cdot I_{BL,i}$ charges the capacitor 132 of the second integration circuit 122 up to an instant $t_7$, analogously to what has been discussed for $t_2 < t < t_4$.

In practice, the counter circuit of FIG. 7 may be configured to count the number of switching events of the first control signal $IN_A$ and/or of the second control signal $IN_B$ to count the number of charge packets associated to the bitline $I_{BL,i}$.

In practice, the digital detectors 16 of FIGS. 13 and 14 may each integrate the bitline current $I_{BL,i}$ of the respective bitline $BL_i$ carrying out a number of successive sampling iterations. In each sampling iteration, for example with reference to a sampling iteration in which the mirrored bitline current $k \cdot I_{BL,i}$ flows through the first integration circuit 121, the integration stage 60 generates the first integration voltage $V_A$ as the time integral of the mirrored bitline current $k \cdot I_{BL,i}$, compares the first integration voltage $V_A$ with the first threshold $V_{th,1}$ and, in response to reaching of the first threshold $V_{th,1}$ by the first integration voltage $V_A$, resets the first integration voltage $V_A$, in particular here by switching the first control signal $IN_A$. The counter circuit 62 may update the respective charge signal $q_i$ in response to reaching of the first threshold $V_{th,1}$ by the first integration voltage $V_A$.

In other words, the digital detectors 16 each sample the respective bitline current $I_{BL,i}$ by converting the bitline current $I_{BL,i}$ into a number of charge packets and counting said charge packets, where each charge packet corresponds to the charge accumulated on the capacitors 127, 132 that causes switching of the second inverters 128, 133.

It follows that the capacitors 127, 132 may have a reduced capacitance if compared with a case where the bitline current is integrated all at once on a single capacitor with capacitance $C_{tot}$. In detail, the capacitance of the capacitors 127, 132 may be lower than the capacitance $C_{tot}$ by a factor $2F$, where $F$ is the number of bits of the charge signal $q_i$.

Consequently, the digital detectors 16 may have a low occupation of die area, and the IMC device 10 may therefore present low production costs.

In addition, the digital detectors 16 each start to discretize the respective bitline current $I_{BL,i}$ while the bitline current $I_{BL,i}$ flows through the respective bitline $BL_i$ (i.e., during the effective elaboration interval $T_C$). Consequently, the charge signal $q_i$ may be ready for the subsequent elaboration operation immediately after the end of the effective elaboration interval $T_C$.

For instance, the digital detectors 16 may each sample the respective bitline current $I_{BL,i}$ until the end-of-count signal STOP_CNT indicates the end of the elaboration interval $T_C$.

Further, according to the embodiment illustrated, the switching circuit 123 disables the first integration circuit 121 and enables the second integration circuit 122, in response to reaching of the first threshold $V_{th,1}$ by the first integration signal $V_A$, and enables the first integration circuit 121 and disables the second integration circuit 122, in response to reaching of the second threshold $V_{th,2}$ by the second integration signal $V_B$.

This allows the bitline current $I_{BL,i}$ to be sampled alternatively by the first integration circuit 121 and by the second integration circuit 122, thus enabling the bitline current $I_{BL,i}$ to charge the capacitor 127 while the capacitor 132 is discharging and to charge the capacitor 132 while the capacitor 127 is discharging. By so doing, no charge may be lost during sampling, and the digital detector 16 may reach a high accuracy of integration of the bitline current $I_{BL,i}$.

Once again with reference to FIG. 14, the integration stage 60 may further comprise a first stop switch and a second stop switch, here a first NMOS transistor 171 and a second NMOS transistor 172, indicated by dashed lines, which prevent the respective digital detector 16 from sampling the respective bitline current $I_{BL,i}$.

In detail, the first and second NMOS transistors 171, 172 have a drain terminal coupled to the output nodes 127, 131 of the first integration circuit 121 and the second integration circuit 122, respectively; and a source terminal coupled to a reference potential line, here ground. The first and second NMOS transistors 171, 172 receive, on the respective gate terminals, the end-of-count signal STOP_CNT.

At the end of the elaboration interval $T_C$, the end-of-count signal STOP_CNT switches to the high logic value, thus switching on the first and second NMOS transistors 171, 172 and shorting to ground the output nodes 127, 131 of the first and second integration circuits 121, 122.

Consequently, the first and second integration circuits 121, 122 stop integrating the bitline current $BL_i$.

Figure 16:
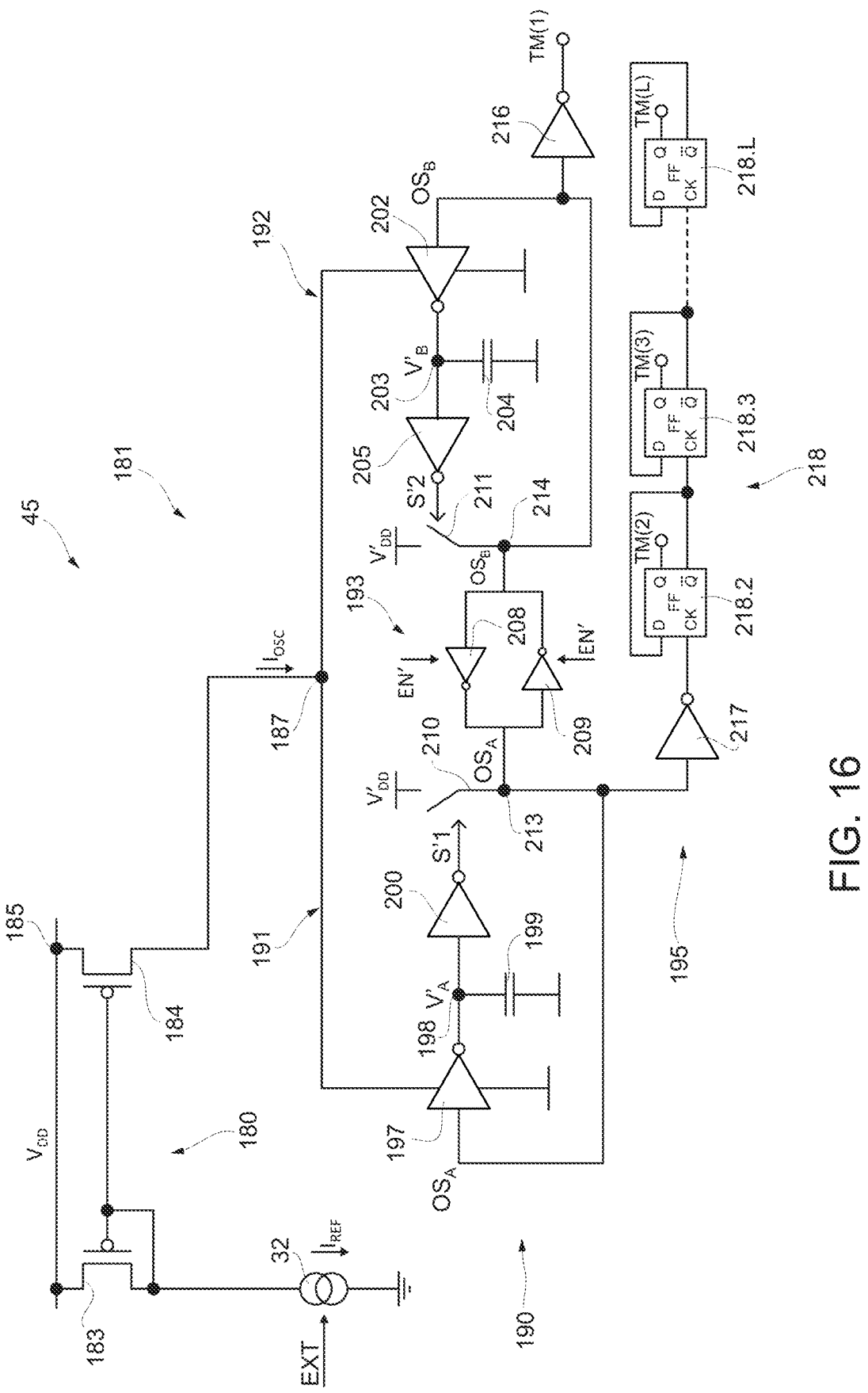
FIGS. 16 and 17 show a detailed circuit diagram of a timer of the circuit of FIG. 3.

According to one embodiment, the timer 45 of FIG. 3 may be formed by a current-controlled oscillator, for example a ring oscillator formed by an odd number of inverters or an oscillator as illustrated in FIG. 16 and having an oscillation frequency $f_o$. In this case, the timer 45 receives a supply current. The oscillation frequency $f_o$ depends upon the supply current.

The update frequency $f_u$ at which the timer 45 updates the timing signal TM depends upon the oscillation frequency $f_o$, and thus upon the supply current.

Consequently, also the elaboration time $T_C$, i.e., the time that the timing signal TM takes to go from the initial value, for example zero (at the instant $t_{start}$), up to the final value MAX_CNT (final instant $t_{end}$) depends upon the supply current of the timer 45.

In practice, it is possible to set a desired elaboration duration $T_C$ by regulating the supply current of the timer 45.

As indicated by a dashed arrow in FIG. 3, the supply current of the timer 45 may be the biasing current $I_b$ generated by the biasing circuit 18 of FIG. 10. In this way, the supply current of the timer 45 may be controlled by the external signal EXT.

In practice, the elaboration duration $T_C$ of the IMC device 10 may be regulated by a user of the IMC device 10.

Furthermore, since the biasing current $I_b$ is generated by the current source 90 and, consequently, is not affected by the drifts of the value transconductance of the biasing array 91, the update frequency $f_u$ of the timer signal TM, and thus the elaboration time $T_C$, is also independent of the drifts of the memory cells 97.

Figure 17:
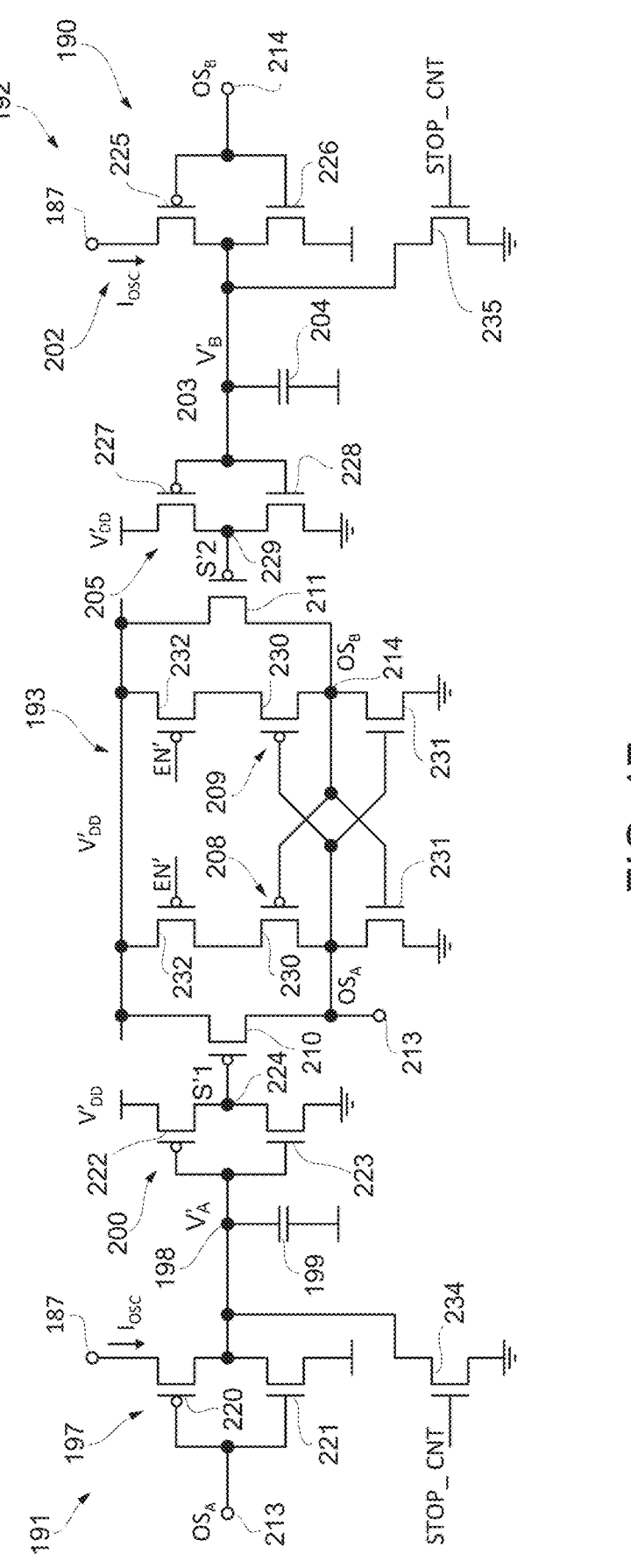

FIGS. 16 and 17 show in detail an embodiment of the current-controlled timer 45.

In detail, the timer 45 comprises a current mirror 180 that generates an oscillator current $I_{OSC}$ from a supply current, here equal to the biasing current $I_b$ of FIG. 12, and a counting portion 181 that provides the timer signal TM from the oscillator current $I_{OSC}$.

The current mirror 180 has a mirroring ratio 1:p so that the oscillator current $I_{OSC}$ will be $p \cdot I_{REF}$.

In detail, the current mirror 180 has a first branch, here formed by a respective PMOS transistor 183, coupled to the current source 32, and a second branch, here formed by a respective PMOS transistor 184, coupled to the counting portion 181.

The sources of the PMOS transistors 183, 184 are coupled to a supply node 185, here at the voltage $V_{DD}$, and the gates of the PMOS transistors 183, 184 are coupled together and to the drain of the PMOS transistor 183. The drain of the PMOS transistor 184 is coupled, in particular here directly connected, to an input node 187 of the counting portion 181.

The counting portion 181 of the timer 45 comprises an integration stage 190, here formed by a first integration circuit 191, a second integration circuit 192, and a switching circuit 193, which is coupled between the first and second integration circuits 191, 192, and a counter stage 195, which is coupled to the integration stage 190 and provides the timer signal TM.

The first and second integration circuits 191, 192 are coupled to the input node 187 so as to receive the oscillator current $I_{OSC}$.

The first integration circuit 191 comprises a first inverter 197 having an output 198, a capacitor 199 with capacitance C'A coupled to the output 198 of the first inverter 197, and a second inverter 200, the input of which is coupled to the output 198 of the first inverter 197.

The first inverter 197 has a supply node coupled to the input node 187 of the counting portion 181 (FIG. 14) and receives at input a first oscillator-control signal $OS_A$.

In practice, the first inverter 197 is biased by the oscillator current $I_{OSC}$.

The capacitor 199 has a first terminal coupled to the output node 198 of the first inverter 197 and a second terminal coupled to a reference-potential node, here to ground.

The output node 198 of the first inverter 197 is at a first oscillator integration voltage V'A dropping across the capacitor 199.

The second inverter 200 has a first oscillator threshold $V'_{th1}$, in what follows referred to simply as first threshold $V'_{th1}$, receives at input the first oscillator integration voltage $V'_A$ and provides at output a first oscillator-switch signal S'1 as a function of the first threshold $V'_{th1}$ and of the first oscillator integration voltage $V'_A$.

In detail, when the first oscillator integration voltage $V'_A$ is lower than the first threshold $V'_{th1}$, the first oscillator-switch signal S'1 has a high logic value. When the first oscillator integration voltage $V'_A$ is higher than the first threshold $V'_{th1}$, the first oscillator-switch signal S'1 has a low logic value.

The second integration circuit 192 comprises a first inverter 202 having an output 203, a capacitor 204 with capacitance $C'_B$ coupled to the output 203 of the first inverter 202, and a second inverter 205, the input of which is coupled to the output 203 of the first inverter 202.

The first inverter 202 has a supply node coupled to the input node 187 of the counting portion 181 (FIG. 14) and receives at input a second oscillator-control signal $OS_B$.

In practice, the first inverter 202 is biased by the oscillator current $I_{OSC}$.

The capacitor 204 has a first terminal coupled to the output node 203 of the first inverter 202 and a second terminal coupled to a node at reference potential, here ground.

The output node 203 of the first inverter 202 is at a second oscillator integration voltage $V'_B$ dropping across the capacitor 204.

The second inverter 205 has a second oscillator threshold $V'_{th2}$, in what follows referred to simply as second threshold $V'_{th2}$, receives at input the second oscillator integration voltage $V'_B$ and provides at output a second oscillator-switch signal S'2 as a function of the second threshold $V'_{th2}$ and of the second oscillator integration voltage $V_B$.

In detail, when the second oscillator integration voltage $V_B$ is lower than the second threshold $V'_{th2}$, the second oscillator-switch signal S'2 has a high logic value. When the second oscillator integration voltage $V'_B$ is higher than the second threshold $V'_{th2}$, the second oscillator-switch signal S'2 has a low logic value.

In this embodiment, the first threshold $V'_{th1}$ of the second inverter 200 is equal to the first threshold $V_{th1}$ of the second inverter 128 of the digital detectors 16 (FIGS. 13 and 14). The second threshold $V'_{th2}$ of the second inverter 205 is equal to the second threshold $V_{th2}$ of the second inverter 133 of the digital detectors 16 (FIGS. 13 and 14).

Once again with reference to FIG. 16, the switching circuit 193 is a latch formed by two inverters 208, 209 arranged in a ring configuration, a first switch 210 controlled by the first oscillator-switch signal S'1, and a second switch 211 controlled by the second oscillator-switch signal S'2.

The switching circuit 193 has a first node 213 coupled to the input of the inverter 209 and to the output of the inverter 208, and a second node 214 coupled to the output of the inverter 209 and to the input of the inverter 208.

The first node 213 provides the first oscillator-control signal $OS_A$. The second node 214 provides the second oscillator-control signal $OS_B$.

The first switch 210 is coupled between the first node 213 and a node at the voltage $V'_{DD}$, and the second switch 211 is coupled between the second node 214 and the node at the voltage $V'_{DD}$.

According to one embodiment, the voltage $V'_{DD}$ of the counting portion 181 of the timer 45 may be equal to the voltage $V'_{DD}$ of the integration stage 60 of the digital detector 16 (FIG. 13).

In the embodiment of FIG. 16, the switching circuit 193 also receives an oscillator-enable signal EN', which controls activation of the switching circuit 193. For instance, the oscillator-enable signal EN' may be used for keeping the switching circuit 193 turned off when it is not in use, thus enabling optimization of energy consumption. Furthermore, the enable signal EN' may be used for setting the switching circuit 193 to a definite state, for example upon switching-on of the IMC device 10.

The counter stage 195 is coupled to the first node 213 and to the second node 214 of the switching circuit 193.

In detail, the charge-counter stage 195 comprises an inverter 216, the input of which is coupled to the second node 214, and a counter that comprises an inverter 217, the input of which is coupled to the first node 213, and a plurality of D flip-flops 218 including a first flip-flop 218.2, a second flip-flop 218.3, and a last flip-flop 218.L, where L is the number of bits of the timer signal TM<L:1>.

In practice, the counter of the charge-counter stage 195 has L−1 flip-flops 218.

The output of the inverter 216 provides the first bit TM(1), i.e., the least significant bit, of the timer signal TM.

The flip-flops 218 are cascaded to one another, in sequence from the first flip-flop 218.2 to the last flip-flop 218.L.

The flip-flops 218 each have a clock input (CK input), a data input (D input), a Q output and a $\overline{Q}$ output.

The CK input of the first flip-flop 218.2 is coupled to the output of the inverter 217. The $\overline{Q}$ output of the first flip-flop 218.2 is sent back to the D input of the first flip-flop 218.2. The Q output of the first flip-flop 218.2 constitutes the second bit TM(2) of the timer signal TM<L:1>.

The CK input of the second flip-flop 218.3 is coupled to the $\overline{Q}$ output of the first flip-flop 218.2. The $\overline{Q}$ output of the second flip-flop 218.3 is sent back to the D input of the second flip-flop 218.3. The Q output of the second flip-flop 218.3 constitutes the third bit TM(3) of the timer signal TM<L:1>.

What has been described for the second flip-flop 218.3 applies, mutatis mutandis, to all the subsequent flip-flop, here not illustrated, up to the L−1-th flip-flop, not illustrated either.

Finally, the CK input of the last flip-flop 218.L is coupled to the $\overline{Q}$ output of the L−1-th flip-flop. The $\overline{Q}$ output of the last flip-flop 218.L is sent back to the D input of the last flip-flop 218.L. The Q output of the last flip-flop 218.L constitutes the most significant bit TM(L) of the timer signal TM<L:1>.

With reference to the detailed implementation of the integration stage 190 illustrated in FIG. 17, the first inverter 197 of the first integration circuit 191 is a CMOS inverter formed by the series circuit of a PMOS transistor 220 and an NMOS transistor 221, mutually coupled at the output node 198. The PMOS and NMOS transistors 220, 221 receive the first oscillator-control signal $OS_A$ at their respective gate terminals.

The source of the PMOS transistor 220 is coupled to the input node 187 of the integration stage 190 of the timer 45.

The second inverter 200 of the first integration circuit 191 is a CMOS inverter formed by the series circuit of a PMOS transistor 222 and an NMOS transistor 223, mutually coupled at a node 224 that provides the first oscillator-switch signal S'1.

The first threshold $V'_{th1}$ of the second inverter 200 is the switching threshold of the second inverter 200, and consequently depends upon the properties, for example upon the threshold or upon the ON-state resistance, of the PMOS and NMOS transistors 222, 223. In practice, the switching threshold may be the input voltage for which the output of the inverter has a high logic value or else the input voltage for which the output of the inverter has a low logic value.

For instance, the switching threshold of the second inverter 200 may be defined as the operating point where the respective input voltage, i.e., the first oscillator integration voltage $V'_A$, is equal to the respective output voltage, i.e., the first oscillator-switch signal S'1.

The first inverter 202 of the second integration circuit 192 is a CMOS inverter formed by the series circuit of a PMOS transistor 225 and an NMOS transistor 226, mutually coupled at the output node 203. The PMOS and NMOS transistors 225, 226 receive the second oscillator-control signal $OS_B$ at their respective gate terminals.

The source of the PMOS transistor 225 is coupled to the input node 187 of the counting portion 190 of the timer 45.

The second inverter 205 of the second integration circuit 192 is a CMOS inverter formed by the series circuit of a PMOS transistor 227 and an NMOS transistor 228, mutually coupled at a node 229 that provides the second oscillator-switch signal S'2.

The second threshold $V'_{th2}$ of the second inverter 205 is the switching threshold of the second inverter 205, and consequently depends upon the properties, for example upon the threshold or upon the ON-state resistance, of the PMOS and NMOS transistors 227, 228. In practice, the switching threshold may be the input voltage for which the output of the inverter has a high logic value or else the input voltage for which the output of the inverter has a low logic value.

For instance, the switching threshold of the second inverter 205 may be defined as the operating point at which the respective input voltage, i.e., the second oscillator integration voltage $V'_B$, is equal to the respective output voltage, i.e., the second oscillator-switch signal S'2.

As illustrated in the detailed implementation of FIG. 17, the first and second inverters 208, 209 of the switching circuit 193 are cross-coupled CMOS inverters, each comprising a respective PMOS transistor 230 and a respective NMOS transistor 231, mutually coupled in series between a supply node, here at the voltage $V'_{DD}$, and ground.

Furthermore, the first and second inverters 208, 209 of the switching circuit 193 each also comprise a respective enable switch, here a PMOS transistor 232, which is coupled between the supply node at the voltage $V'_{DD}$ and the PMOS transistor 230 of the respective inverter.

The PMOS transistors 232 are controlled by the oscillator-enable signal EN'.

In this embodiment, the timer 45 comprises, with reference to FIG. 17, a first stop switch and a second stop switch, here a first NMOS transistor 234 and a second NMOS transistor 235, which are configured to interrupt updating of the timer signal TM by the timer 45.

In detail, the first and second NMOS transistors 234, 235 have a drain terminal coupled to the output nodes 198, 203 of the first integration circuit 191 and of the second integration circuit 192, respectively; and a source terminal coupled to a reference, here ground. The first and second NMOS transistors 234, 235 receive, at their respective gate terminals, the end-of-count signal STOP_CNT.

When the end comparator 47 (FIG. 3) switches the end-of-count signal STOP_CNT to the high logic value, the first and second NMOS transistors 234, 235 are on, thereby shorting to ground the output nodes 198, 203 of the first integration circuit 191 and of the second integration circuit 192.

Consequently, the timer 45 stops updating the timer signal TM.

In practice, in this embodiment, the timer 45, in particular the respective integration stage 181, has a circuit diagram equal to the circuit diagram of any one of the digital detectors 16 of FIG. 13, in particular of the respective integration stage 60.

It follows that the timer 45 generates the timer signal TM<L:1> from the oscillator current $I_{OSC}$ in the same way in which any one of the digital detectors 16 generates the charge signal $q_i$ from the respective bitline current $I_{BL,i}$.

Consequently, the timer 45 may generate the timer signal TM<L:1> by performing a number of successive timing iterations. In each timing iteration, for example with reference to a timing iteration in which the oscillator current $I_{OSC}$ flows through the first integration circuit 191, the integration stage 190 generates the first oscillator integration voltage $V'_A$ as the time integral of the oscillator current $I_{OSC}$, compares the first oscillator integration voltage $V'_A$ with the first threshold $V'_{th,1}$, and, in response to reaching of the first threshold $V'_{th,1}$ by the first oscillator integration voltage $V'_A$, resets the first oscillator integration voltage $V'_A$, in particular here switching the first oscillator-control signal $OS_A$. The counter stage 195 updates the timer signal TM<L:1> in response to reaching of the first threshold $V'_{th,1}$ by the first oscillator integration voltage $V'_A$.

In this embodiment, the least significant bit of the timer signal TM is the value of the second oscillator-control signal $OS_B$.

In other words, the timer 45 may sample the oscillator current $I_{OSC}$ by converting the oscillator current $I_{OSC}$ into a number of charge packets and counting said charge packets, wherein each charge packet corresponds to the charge accumulated on the capacitors 199, 204 that causes switching of the second inverters 200, 205.

It follows that the update frequency $f_u$ of the timer signal TM<L:1> is given by the frequency of the switching events of the first oscillator-control signal $OS_A$ (analogously to what has been discussed for the first control signal $IN_A$ with reference to FIG. 13). The update frequency $f_u$ thus depends upon the value of the oscillator current $I_{OSC}$, i.e., upon the biasing current $I_b$ and upon the mirror factor p of the current mirror 180, upon the capacitances $C'_A$, $C'_B$, and upon the first and second threshold $V'_{th,1}$, $V'_{th,2}$ of the second inverters 200, 205.

In practice, the integration stage 60 of the timer 45 behaves like a current-controlled oscillator.

In use, the fact that the timer 45 generates the timer signal TM<L:1> from the oscillator current $I_{OSC}$ in the same way in which the digital detectors 16 each generate the respective charge signal $q_i$ from the respective bitline current $I_{BL,i}$, in particular the fact that the respective integration circuits 60, 181 have the same circuit diagram, enables a strong correlation to be obtained between the timer signal TM<L:1> and the charge signals $q_1, \ldots, q_M$.

Consequently, global variations that may affect the IMC device 10, such as drifts of the supply voltages $V_{DD}$, $V'_{DD}$ and/or temperature variations, are compensated by the timer 45 and by the digital detectors 16, without in this way affecting the precision of the MAC operation executed by the IMC device 10.

By varying the oscillator current $I_{OSC}$, for example by varying the biasing current $I_b$ via the external signal EXT, it is possible to modify the update frequency $f_u$ of the timer signal TM<L:1> and, consequently, the theoretical (and effective) elaboration time of the IMC device 10.

In fact, for example, an increase of the oscillator current $I_{OSC}$ implies that the oscillator-integration voltages $V'_A$, $V'_B$ (FIGS. 13 and 14) increase faster; consequently, the first and second oscillator control signals $OS_A$, $OS_B$ switch faster, thus increasing also the update frequency $f_u$ of the timer signal TM<L:1>.

Finally, it is clear that modifications and variations may be made to what has been described and illustrated herein, without thereby departing from the scope of the present invention, as defined in the annexed claims.

For instance, the difference between the positive theoretical duration $T^*_{j,+}$ and the negative theoretical duration $T^*_{j,-}$ may be a function of the sign and of the absolute value of the respective input value $x_j$ different from what has been described and illustrated above, for example, a linear function different from the direct or inverse proportionality, or a nonlinear function.

For instance, the difference between the positive current $I^+_{i,j}$ and the negative current $I^-_{i,j}$ may be a function of the sign and of the absolute value of the respective computational weight $G_{i,j}$ different from what has been described and illustrated above, for example, a linear function different from the direct or inverse proportionality, or a nonlinear function.

For instance, the computational weights $G_{i,j}$ may not be signed. In this case, the difference between the positive current $I^+_{i,j}$ and the negative current $I^-_{i,j}$, may be a function of the absolute value of the respective computational weight $G_{i,j}$, according to the specific mapping function used during programming of the memory array 12.

For instance, the input-to-time converters 46 may be configured so that the sign of the difference $T^*_{j,+}-T^*_{E1}$ is opposite to what has been described with reference to FIGS. 4 and 5; i.e., it may be $T^*_{j,+}<T^*_{E1}$ if $x_j>0$ and $T^*_{j,+}>T^*_{E1}$ if $x_j<0$. In other words, it may be that if $x_j>0$, then $T^*_{j,+}-T^*_{j,-}<0$, and if $x_j>0$, then $T^*_{j,+}-T^*_{j,-}>0$.

For instance, the groups of cells may be programmed so that the sign of the difference $I^+_{i,j}-I_{ref}$ is opposite to the one described previously; i.e., it may be $I^+_{i,j}<I_{ref}$ if $G_{i,j}>0$ and $I^+_{i,j}>I_{ref}$ if $G_{i,j}<0$, and thus $I^+_{i,j}-I^-_{i,j}<0$ if $G_{i,j}>0$ and $I^+_{i,j}-I^-_{i,j}>0$ if $G_{i,j}<0$.

For instance, with reference to step S02 of FIG. 4, each input-to-time converter 46 may verify whether the positive theoretical duration $T^*_{j,+}$ is only greater than (and not greater than or equal to) the negative theoretical duration $T^*_{j,-}$. In other words, in this case, if $x_j=0$ and thus $T^*_{j,+}=T^*_{j,-}$, the input-to-time converter 46 proceeds with step S05 (and not with step S03).

For instance, the memory cells 20 may be multilevel memory cells, with a number of levels greater than three. For instance, the table of FIG. 16 shows the charge values $Q_{ij}$ associated to the group of cells 22$_{i,j}$ during the elaboration interval $T_C$ in the case where the cells 20 may be programmed in one of five different transconductance levels.

In the example of FIG. 18, the cells 20 may be programmed so that the respective currents $I^+_{i,j}$, $I^-_{i,j}$ may each assume five values equal to 0 μA, 1 μA, 2 μA, 3 μA, or 4 μA. In this example, further, we have that $I_{tot}=4$ μA and $I_{ref}=I_{tot}/2=2$ μA.

Furthermore, also in this example, the input value $x_j$ may assume values comprised between −64 and +64, $T^*_C=128$ ns and $T_{E1}=T^*_C/2$.

As may be seen in the example of FIG. 18, for $I^+_{i,j}=I^-_{i,j}=I^-_{i,j}=I_{ref}$ and/or for $T^*_{j,+}=T^*_{j,-}=T_{E1}$, the charge $Q^*_{i,j}$ assumes a same value that is equal to the reference charge $Q_{ref}$.

Combinations of the product $G_{i,j}\cdot x_j$ having a positive result correspond to $Q^*_{i,j}>Q_{ref}$, and combinations of the product $G_{i,j}\cdot x_j$ having a negative result correspond to $Q^*_{i,j}<Q_{ref}$.

For instance, each group of memory cells of the computation array 12 may comprise a positive subset of cells and a negative subset of cells having a number of cells greater than one (FIGS. 1 and 2) or two (FIG. 11), according to the specific implementation of the memory cells and to the number of values of the respective computational weight $G_{i,j}$ that is to be mapped.

For instance, the memory cells 20, 72, 97 may be resistive memory cells not based upon PCM materials, but upon different technologies; for example, they may be magnetoresistive memory cells (MRAMs), resistive memory cells (RRAMs), or static memory cells (SRAMs).

The row-activation unit 14 may also receive an address signal ADR (dashed arrow in FIG. 3) indicating which wordlines to activate during the effective elaboration interval $T_C$. For instance, the address signal ADR may be used to cause activation, in use, only of some of the plurality of wordlines, for example if the input vector X has a number of values less than N.

For instance, with reference to FIG. 1, the positive cell 23A and the negative cell 23B of a group of cells 22$_{i,j}$ may be arranged on two rows of the memory array 12 that are not adjacent to one another. The positive cell 23A and the negative cell 23B of a group of cells 22$_{i,j}$ may be arranged on two different columns of the memory array 12 that may be coupled together, in use, via specific column-selection circuits, in themselves known.

For instance, the IMC device 10 may comprise a number of digital detectors 16 smaller than the number M of columns of the array 12. In this case, generation of the charge signals $q_1, \ldots, q_M$ starting from the respective currents $I_{BL,1}, \ldots, I_{BL,M}$ may be controlled by purposely provided multiplexer circuits in themselves known.

For instance, the biasing circuit 18 may be configured to generate biasing voltages that are different for each column of the array 12 or for each group of cells 22$_{i,j}$ so that the positive-cell currents $I^+_{i,j}$ and the negative-cell currents $I^-_{i,j}$ of each group of cells 22$_{i,j}$ may be regulated not just as a function of the respective programmed transconductance value, but also of the respective biasing voltage received.

Finally, the different embodiments described above may be combined so as to provide further solutions.

The invention claimed is:

1. An in-memory computation (IMC) device for performing a multiply-and-accumulate (MAC) operation, configured to receive an input signal indicative of a plurality of input values each having a respective sign and a respective absolute value, and to provide at least one output signal, the device comprising:

a computation memory array comprising a plurality of groups of memory cells coupled to a bitline, each group of memory cells configured to store a respective computational weight and comprising a positive memory cell coupled to a respective positive wordline and a negative memory cell coupled to a respective negative wordline; and a row-activation circuit configured to receive the input signal and to provide, for each input value, during an effective elaboration interval, a positive-activation signal having a positive-activation duration to the positive wordline of a respective group of memory cells and a negative-activation signal having a negative-activation duration to the negative wordline of the respective group of memory cells, a sum of the positive-activation duration and the negative-activation duration being equal to a duration of the effective elaboration interval, the effective elaboration interval comprising a first elaboration phase and a second elaboration phase subsequent to the first elaboration phase;

wherein the row-activation circuit is further configured, for each input value, to:

determine a positive theoretical duration of the positive-activation signal and a negative theoretical duration of the negative-activation signal, wherein the positive theoretical duration and the negative theoretical duration are each an algebraic sum of a reference value that does not depend upon the input value and a variable value that varies as a function of the sign and the absolute value of the input value, so that the sum of the respective positive theoretical duration and the respective negative theoretical duration is equal to a theoretical elaboration duration; and provide first, during the effective elaboration interval, the positive-activation signal and the negative-activation signal whose theoretical durations are greater than or equal to the reference value, wherein the activation duration of one said positive-activation signal and the negative-activation signal being equal to the sum of an effective reference value, which is equal to the reference value reduced by a reduction factor, and the variable value, and wherein the activation duration of the other of said positive-activation signal and the negative-activation signal being equal to the respective theoretical duration;

the first elaboration phase of the effective elaboration interval having a duration equal to the effective reference value;

the positive memory cell of a respective group of memory cells being configured to be activated by the respective positive-activation signal and through which a positive-cell current flows when activated;

the negative memory cell of the respective group of memory cells being configured to be activated by the respective negative-activation signal and through which a negative-cell current flows when activated;

wherein, for each group of memory cells, the positive-cell current and the negative-cell current are a function of the respective computational weight stored by the group of memory cells;

wherein a bitline current flows through the bitline during the effective elaboration interval that is a function of a sum of the positive-cell currents and the negative-cell currents of the groups of memory cells coupled to the bitline;

a column-elaboration circuit coupled to the bitline and configured to sample the bitline current and provide, in response thereto, the at least one output signal, wherein the bitline current during the first elaboration phase is sampled as a function of the reduction factor.

2. The IMC device according to claim 1, wherein the reference value is equal to one half of the duration of the theoretical elaboration interval.

3. The IMC device according to claim 1, wherein, for each input value, the sign of the variable value is a function of the sign and/or of the absolute value of the respective input value.

4. The IMC device according to claim 1, wherein, for each input value, the sign of the variable value is a function of the sign of the respective input value and not of the absolute value of the respective input value.

5. The IMC device according to claim 1, wherein, for each input value, the absolute value of the variable value is a function of the sign and/or of the absolute value of the respective input value.

6. The IMC device according to claim 1, wherein, for each input value, the absolute value of the variable value is a function of the absolute value of the respective input value and not of the sign of the respective input value.

7. The IMC device according to claim 1, wherein, for each input value, the variable value is a monotonic function of the respective input value.

8. The IMC device according to claim 1, wherein, for each input value, the variable value is directly proportional to the respective input value.

9. The IMC device according to claim 1, wherein, for each input value, the positive theoretical duration is equal to the negative theoretical duration when the input value is equal to zero.

10. The IMC device according to claim 1, wherein the row-activation circuit comprises:

a timing circuit configured to provide a timing signal defining the effective elaboration interval between a start instant and an end instant; and a plurality of input-to-time converters, one for each input value, each configured to generate a signal indicative of one of the respective positive-activation duration and the respective negative-activation duration, compare said signal with the timing signal and, in response, provide the respective positive-activation signal and the respective negative-activation signal.

11. The device according to claim 10, wherein, for each input value, the respective input-to-time converter is configured to provide the one of the positive-activation signal and the negative-activation signal from the start instant of the effective elaboration interval up to a respective switching instant comprised between the start instant and the end instant of the effective elaboration interval, and provide the other of the positive-activation signal and the negative-activation signal from the respective switching instant up to the end instant of the effective elaboration interval.

12. The IMC device according to claim 1, wherein the column-elaboration circuit comprises:

a digital detector configured to generate a measured-charge signal indicative of the integral of the bitline current during the effective elaboration interval and provide, in response thereto, a charge signal;

wherein the digital detector is further configured to multiply, during the first elaboration phase, the measured-charge signal by the reduction factor, the charge signal being thus indicative of the charge that would have flowed in the bitline during the theoretical elaboration interval.

13. The IMC device according to claim 12, wherein the column-elaboration circuit is further configured to compare the charge signal with a reference-charge signal and, in response thereto, determine the sign and absolute value of a result of the multiply-and-accumulate operation, the reference-charge signal being indicative of the charge that would have flowed in the bitline during the theoretical elaboration interval if all the input values had been zero and/or if all the computational weights of the groups of memory cells coupled to the bitline had been zero.

14. The IMC device according to claim 13, further comprising a reference circuit configured to generate the reference-charge signal comprising:

a reference memory array comprising at least one group of memory cells coupled to a reference bitline and configured to receive, during the effective elaboration interval, at least one reference activation signal having a reference activation duration;

wherein a reference current that flows through the reference bitline during the effective elaboration interval corresponds to a charge that would flow in the bitline of the computation memory array, during the theoretical elaboration interval, if all the input values were zero and/or if all the computational weights of the groups of memory cells coupled to the bitline of the computation memory array were zero; and an elaboration circuit configured to sample the reference bit current during the elaboration interval and providing, in response thereto, the reference-charge signal.

15. The IMC device according to claim 1, wherein the positive memory cell and the negative memory cells of each group of memory cells each comprise a respective multilevel memory cell configured to be programmed to one of three or more transconductance levels.

16. The IMC device according to claim 1, wherein the positive memory cell and the negative memory cell of each group of memory cell each comprise a respective two-level memory cell configured to be programmed to one of two transconductance levels.

17. The IMC device according to claim 1, wherein the positive memory cell and the negative memory cell of each group of memory cells comprise a nonvolatile phase-change memory cell, and wherein each nonvolatile phase-change memory cell has a current path that comprises a storage element and a selection element and extending between a common node and a reference-potential node;

wherein the selection element of the positive memory cell and the negative memory cell being configured to close selectively the respective current path in response to reception of the positive-activation signal and of the negative-activation signal, respectively.

18. A method for controlling an in-memory computation (IMC) device to perform a multiply-and-accumulate (MAC) operation using a computation memory array comprising a plurality of groups of memory cells coupled to a bitline, the method comprising:

storing a respective computational weight having a sign and an absolute value in each group of memory cells, wherein each group of memory cells includes a positive memory cell coupled to a respective positive wordline and a negative memory cell coupled to a respective negative wordline;

activating the positive memory cell by a respective positive-activation signal on the respective positive word-line;

activating the negative memory cell by a respective negative-activation signal on the respective negative wordline;

flowing a respective positive-cell current by the respective positive memory cell for each group of memory cells in response to the respective positive-activation signal;

flowing a respective negative-cell current by the respective negative memory cell for each group of memory cells in response to the respective negative-activation signal;

wherein, for each group of memory cells, the positive-cell current and the negative-cell current are a function of the respective computational weight;

providing during an effective elaboration interval, in response to an input signal indicative of a plurality of input values each having a respective sign and a respective absolute value, for each input value, the positive-activation signal having a positive-activation duration to the positive wordline of a respective group of memory cells and the negative-activation signal having a negative-activation duration to the negative wordline of the respective group of memory cells;

wherein providing the positive-activation signal and the negative-activation signal comprises:

determining a positive theoretical duration of the positive-activation signal and a negative theoretical duration of the negative-activation signal;

wherein the positive theoretical duration and the negative theoretical duration are each an algebraic sum of a reference value that does not depend upon the input value and a variable value that varies as a function of the sign and of the absolute value of the respective input value, so that a sum of the respective positive theoretical duration and the respective negative theoretical duration is equal to a theoretical elaboration duration; and providing first, during the effective elaboration interval, the positive-activation signal and the negative-activation signal, wherein one of the positive-activation signal and the negative-activation signal whose theoretical duration is greater than or equal to the reference value has an activation duration equal to a sum of an effective reference value equal to the reference value reduced by a reduction factor and the variable value, and the other of the positive-activation signal and the negative-activation signal has an activation duration equal to the respective theoretical duration;

wherein the first elaboration phase of the effective elaboration interval has a duration equal to the effective reference value;

flowing a bitline current through the bitline coupled to the groups of memory cells during the effective elaboration interval that is a function of the sum of the positive-cell currents and the negative-cell currents of the groups of memory cells coupled to the bitline; and sampling the bitline current during the first elaboration phase as a function of the reduction factor and providing, in response thereto, at least one output signal.

19. The control method according to claim 18, wherein each computational weight has a sign and an absolute value, each group of memory cells being programmed so that a linear sum of the respective positive-cell current and the respective negative-cell current is equal to a total current and that a difference between the respective positive-cell current and the respective negative-cell current is a function of the sign and of the absolute value of the respective computational weight.

20. The control method according to claim 19, wherein, for each group of memory cells, the sign of the difference between the respective positive-cell current and the respective negative-cell current is a function of the sign and/or of the absolute value of the respective computational weight.

21. The control method according to claim 19, wherein, for each group of memory cells, the sign of the difference between the respective positive-cell current and the respective negative-cell current is a function of the sign and not of the absolute value of the respective computational weight.

22. The control method according to claim 19, wherein, for each group of memory cells, the absolute value of the difference between the respective positive-cell current and the respective negative-cell current is a function of the sign and/or of the absolute value of the respective computational weight.

23. The control method according to claim 19, wherein, for each group of memory cells, the absolute value of the difference between the respective positive-cell current and the respective negative-cell current is a function of the absolute value and not of the sign of the respective computational weight.

24. The control method according to claim 19, wherein, for each group of memory cells, the difference between the respective positive-cell current and the respective negative-cell current is a monotonic function of the respective computational weight.

25. The control method according to claim 19, wherein, for each group of memory cells, the respective positive-cell current is equal to the respective negative-cell current when the respective computational weight is equal to zero.

* * * * *